United States Patent
Yamaguchi et al.

(10) Patent No.: US 11,715,704 B2
(45) Date of Patent: Aug. 1, 2023

(54) SCRIBE STRUCTURE FOR MEMORY DEVICE

(71) Applicant: Micron Technology, Inc., Boise, ID (US)

(72) Inventors: Hidenori Yamaguchi, Hiroshima (JP); Yoh Matsuda, Hiroshima (JP); Yuta Nomura, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/230,827

(22) Filed: Apr. 14, 2021

(65) Prior Publication Data
US 2022/0336373 A1  Oct. 20, 2022

(51) Int. Cl.
| | |
|---|---|
| *H01L 23/00* | (2006.01) |
| *H01L 23/544* | (2006.01) |
| *H10B 12/00* | (2023.01) |

(52) U.S. Cl.
CPC .......... *H01L 23/562* (2013.01); *H01L 23/544* (2013.01); *H01L 2223/5446* (2013.01); *H10B 12/00* (2023.02)

(58) Field of Classification Search
CPC ... H01L 23/562; H01L 23/544; H01L 27/108; H01L 2223/5446; H01L 23/3178; H01L 23/53295; H01L 21/3043; H01L 21/76801; H01L 21/76805; H01L 21/76831; H01L 21/76832; H01L 21/76895; H01L 21/78; H01L 23/5283; H10B 12/00; H10B 12/50
See application file for complete search history.

(56) References Cited

U.S. PATENT DOCUMENTS

| | | | |
|---|---|---|---|
| 7,417,304 B2 | 8/2008 | Tsutsue | |
| 7,453,128 B2 | 11/2008 | Tsutsue et al. | |
| 2002/0055256 A1* | 5/2002 | Jiang | H01L 21/76807 257/E21.579 |
| 2003/0143819 A1 | 7/2003 | Hedler et al. | |
| 2005/0040532 A1* | 2/2005 | Kumar | H01L 23/53295 257/E21.579 |
| 2005/0142862 A1* | 6/2005 | Chun | H01L 23/53295 438/618 |

(Continued)

OTHER PUBLICATIONS

U.S. Appl. No. 17/230,772, titled "Scribe Structure for Memory Device", filed Apr. 14, 2021.

(Continued)

*Primary Examiner* — Thanh T Nguyen
(74) *Attorney, Agent, or Firm* — Dorsey & Whitney LLP

(57) ABSTRACT

Apparatuses and methods for manufacturing chips are described. An example method includes: forming at least one first dielectric layer above a substrate; forming at least one second dielectric layer above the first dielectric layer; forming a cover layer above the at least one second dielectric layer; forming a groove above the substrate by etching; covering at least an edge surface of the at least one first dielectric layer in the groove with a liner; forming a hole through the cover layer and a portion of the at least one second dielectric layer; depositing a conductive layer in the hole, on the cover layer and the liner; and forming a conductive pillar on the conductive layer in the hole by electroplating.

14 Claims, 17 Drawing Sheets

(56) References Cited

U.S. PATENT DOCUMENTS

| | | | |
|---|---|---|---|
| 2009/0283311 A1* | 11/2009 | Ida | H01L 27/14683 29/846 |
| 2010/0059895 A1 | 3/2010 | Wakisaka | |
| 2013/0113068 A1* | 5/2013 | Ramachandran | H01L 23/481 438/667 |
| 2013/0181329 A1 | 7/2013 | Wada | |
| 2015/0235845 A1* | 8/2015 | Sekita | H01L 23/3114 438/667 |
| 2015/0287687 A1 | 10/2015 | Farrens et al. | |
| 2016/0079204 A1 | 3/2016 | Matsubara et al. | |
| 2016/0365340 A1 | 12/2016 | Tajima et al. | |
| 2017/0256638 A1 | 9/2017 | Macelwee et al. | |
| 2018/0096952 A1 | 4/2018 | Miccoli | |
| 2019/0035750 A1 | 1/2019 | Han et al. | |
| 2020/0312715 A1 | 10/2020 | Choi et al. | |
| 2021/0391279 A1 | 12/2021 | Sugioka et al. | |

OTHER PUBLICATIONS

U.S. Appl. No. 17/237,992, titled "Scribe Structure for Memory Device", filed Apr. 22, 2021.

* cited by examiner

SCRIBE STRUCTURE FOR MEMORY DEVICE

BACKGROUND

High data reliability, high speed of memory access, lower power consumption and reduced chip size are features that are demanded from semiconductor memory. In recent years, some semiconductor devices such as dynamic random-access memory (DRAM) devices include a low-k film of an insulating material, such as silicon oxycarbide (SiOC) and silicon carbonitride (SiCN), having a low dielectric constant (k) that exhibits weaker electric polarization between conductive layers. The low-k film is included to reduce parasitic capacitance between the conductive layers and thus to achieve high speed operations of electronic circuits in the semiconductor devices.

However, the low-k material has weak thermo-mechanical characteristics. For example, a low-k film has lower adhesion to its adjacent conductive layer or conductive components (e.g., interconnects) compared to a silicon dioxide (SiO2) film and a silicon nitride (Si3N4) film. Additionally, the low-k material is brittle. Once semiconductor elements are formed on a semiconductor wafer, the semiconductor wafer is diced into semiconductor chips. During the dicing process, cracks may be produced. The cracks may propagate through a film interface between the low-k film and another dielectric film (e.g., between SiO2 and SiOC films, between SiCN/SiO2 films, etc.) and reach an element formation region of the semiconductor device, which results in a lower yield of the semiconductor devices.

In order to reduce the cracks during the dicing process, a groove may be formed in a scribe region film prior to dicing, such as by etching through layers including the low-k film. However, the edge surfaces of the low-k film facing the groove tend to have a concave shape due to the brittle characteristics of the low-k material. In order to form conductive pillar bumps on wires coupled to interconnects through layers, a conductive seed layer may be formed as an initial step of electroplating of the conductive material. However, because a conductive seed layer deposited on the concave portion of the low-k film tends to be discontinuous from one concave portion to another, the deposited layer fails to function as a seed layer.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
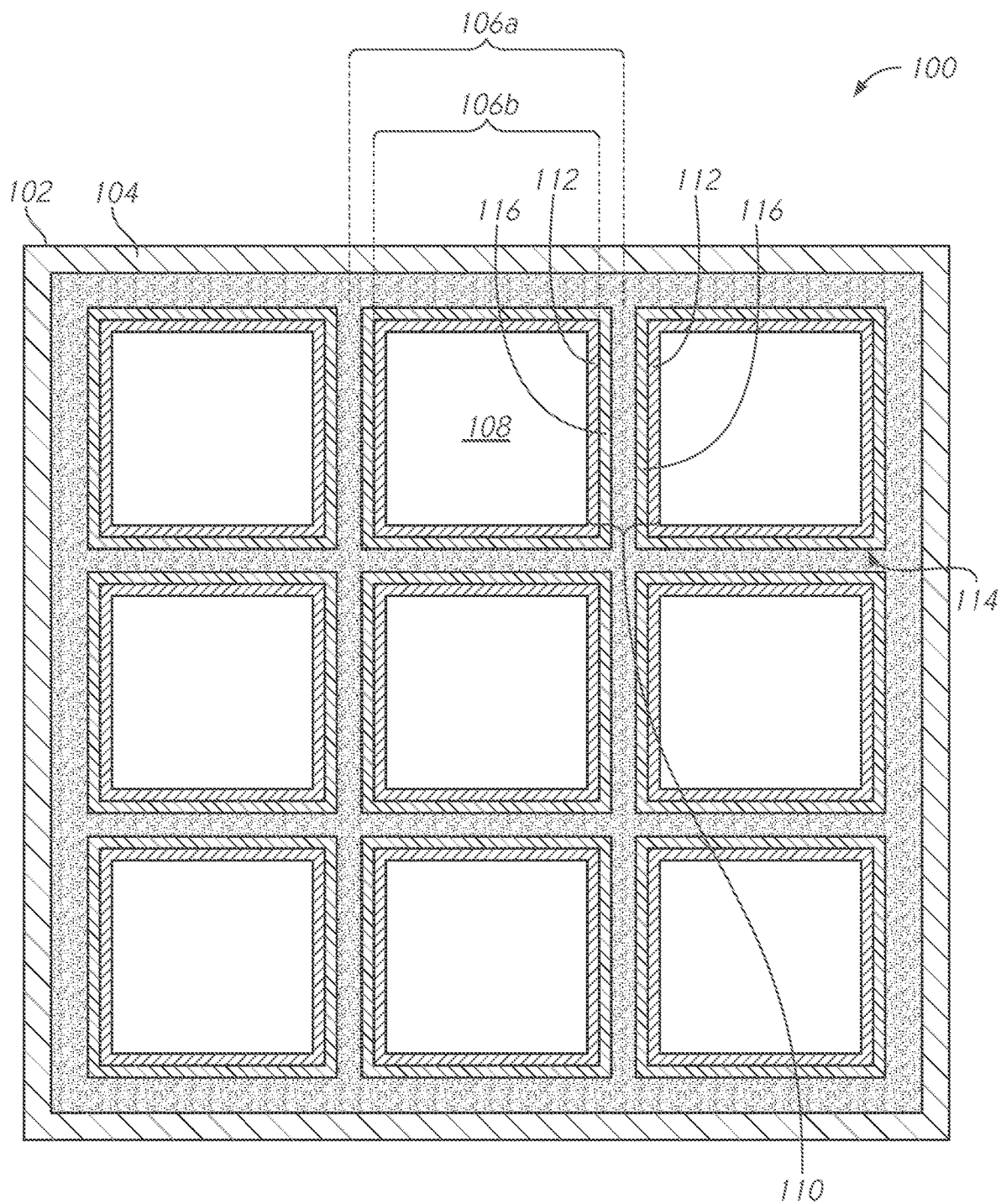
FIG. 1 is a diagram for a layout of a semiconductor device in accordance with an embodiment of the present disclosure.

FIG. 1 is a diagram for a layout of a semiconductor device 100 in accordance with an embodiment of the present disclosure. FIG. 1 is a plan view illustrating a schematic configuration of a layout of a plurality of circuit regions 108 and scribe regions 110 formed on a semiconductor device 100. In some embodiments, the semiconductor device 100 may be a semiconductor wafer. The semiconductor device 100 may include a mask region 102. The semiconductor device 100 may be manufactured using photo patterning by applying a mask, such as a photoresist, on each mask region 102. The semiconductor device 100 may include a margin region 104 along the perimeter of the mask region 102.

In some embodiments, the circuit regions 108 may be disposed in a matrix and each circuit region 108 may have a rectangular shape. In each circuit region 108, transistors and circuit components, such as conductive interconnects may be disposed. For example, the transistors and the circuit components may include a plurality of memory cells, one or more circuits that provide memory access functions, such as read operations and write operations to the memory cells, and a control circuit that controls the circuits.

The semiconductor wafer 100 in FIG. 1 may be in a state before the semiconductor wafer 100 is separated into semiconductor chips. In some embodiments, each of the semiconductor chips may be a chip 106a. In another embodiments, each of the semiconductor chips may be a chip 106b. The scribe region 110 may be disposed around each circuit region 108. The scribe region 110 may include a circuit edge 112 of each chip 106a surrounding each circuit region 108. In some embodiments, the circuit edge 112 may include a test element group (not shown) including test circuits. The scribe region 110 may also include grooves 116 between the circuit edges 112 of adjacent chips, and further includes a scribe center region 114 between the grooves 116. In some embodiments, some portion of the scribe region 110 may be etched to provide the grooves 116. In some embodiments, dicing lines may be defined in the scribe center region 114 for separating the semiconductor wafer 100 into individual semiconductor chips 106a. In some embodiments, dicing lines may be defined in the grooves 116 for separating the semiconductor wafer 100 into individual semiconductor chips 106b.

Figure 2B:
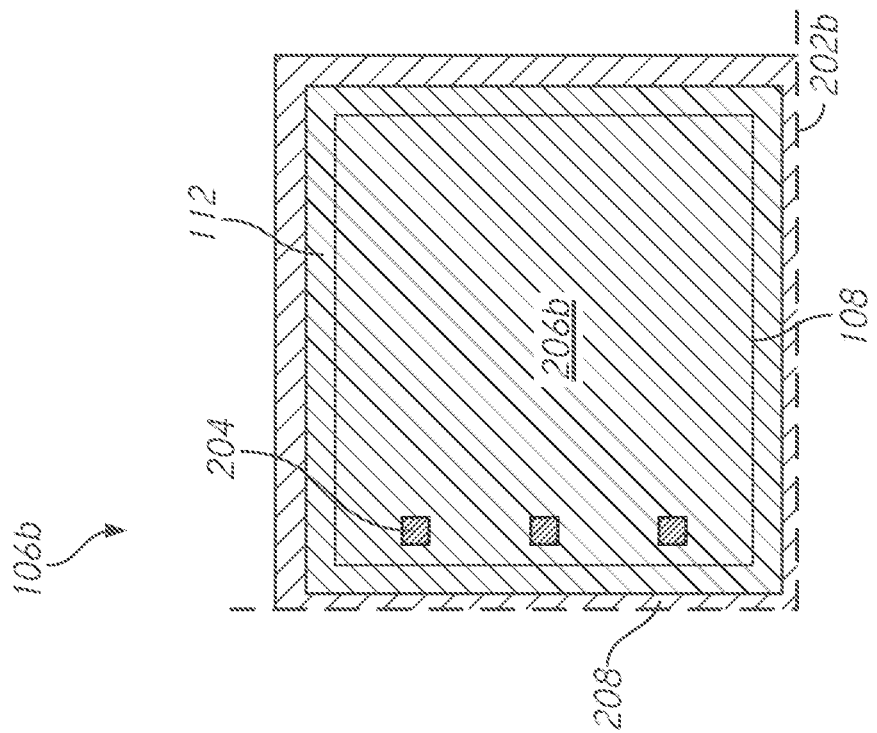
FIG. 2B is a diagram of a top view of a semiconductor chip in accordance with an embodiment of the present disclosure.
Figure 2A:
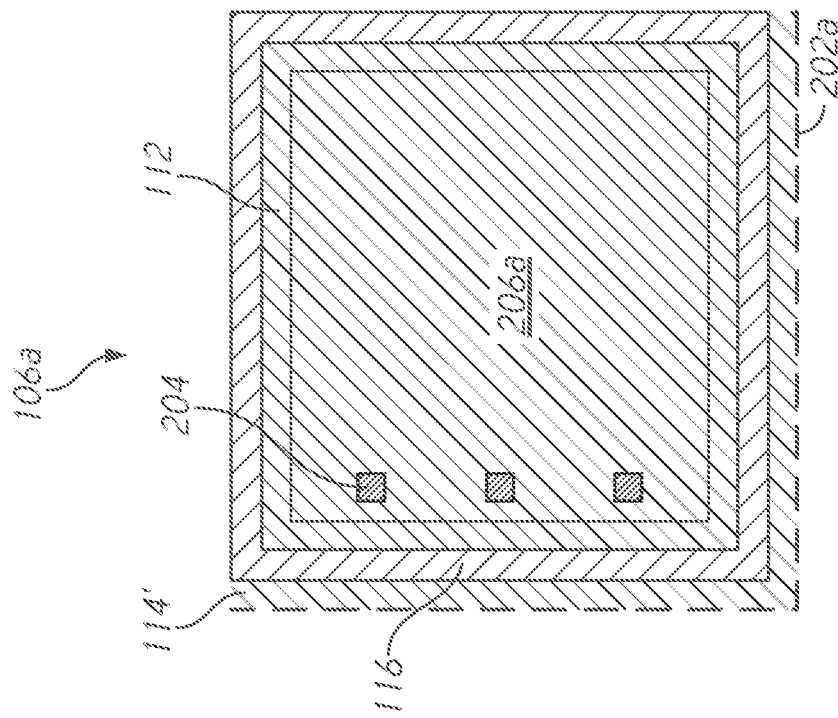
FIG. 2A is a diagram of a top view of a semiconductor chip in accordance with an embodiment of the present disclosure.

FIG. 2A is a diagram of a top view of the semiconductor chip 106a in accordance with an embodiment of the present disclosure. The semiconductor chip 106a may include a circuit region 108 surrounded by a circuit edge 112. In some embodiments, separating the semiconductor wafer 100 in FIG. 1 into chips 106a may be performed by a dicing step. The dicing step may be performed along dicing lines 202a in the scribe center region 114. After the dicing step, a portion 114' of the scribe center region 114 may remain outside the groove 116 of the semiconductor chip 106a. A cover layer 206a may be disposed on the top of the semiconductor chip 106a, including the scribe center region 114, the circuit edge 112 and the circuit region 108. The cover layer 206a may include holes, and conductive pillars 204 through the cover layer 206a that may be disposed in the circuit region 108. The conductive pillars 204 may be coupled to pads of the chip 106a.

FIG. 2B is a diagram of a top view of the semiconductor chip 106b in accordance with an embodiment of the present disclosure. The semiconductor chip 106b may include a circuit region 108 surrounded by a circuit edge 112 of the semiconductor chip 106a. In some embodiments, separating the semiconductor wafer 100 in FIG. 1 into chips 106b may be performed by a dicing step. The dicing step may be performed along dicing lines 202b in the grooves 116 of FIG. 1. After the dicing step, a portion 208 of the groove 116 may remain with the circuit edge 112 and the circuit region 108 of the semiconductor chip 106b. A cover layer 206b may be disposed on the top of the semiconductor chip 106b, including the circuit edge 112 and the circuit region 108. The cover layer 206b may include holes, and conductive pillars 204 through the cover layer 206b that may be disposed in the circuit region 108. The conductive pillars 204 may be coupled to pads of the chip 106b. In some embodiments, the cover layer 206a or the cover layer 206b may be a dielectric film, and may include silicon nitride (Si3N4) and/or silicon carbide (SiC). In some embodiments, the conductive pillars 204 may include copper (Cu) or nickel (Ni).

In the following description of FIGS. 3-15, some embodiments with a wafer with grooves 116, a scribe center region disposed between the grooves and a dicing line in the scribe center region. Alternatively, some embodiments with a wafer with a groove and a dicing line in the groove (not shown). However, each embodiment is not limited to one of these wafers; dicing lines may be provided in either scribe center regions or in grooves for each of the following embodiments.

In some embodiments, a cover layer and liners may include dielectric material in common, such as silicon nitride (Si3N4) and/or silicon carbide (SiC). The liners may cover edge surfaces lower dielectric films (e.g., low-k films). The edge surfaces of lower dielectric films may have roughness. The edge surfaces of lower dielectric films may have concave portions, for example. In another example, the edge surfaces of lower dielectric films may be uneven. The liner may cover edge surfaces of upper dielectric films above the lower dielectric films.

Figure 3:
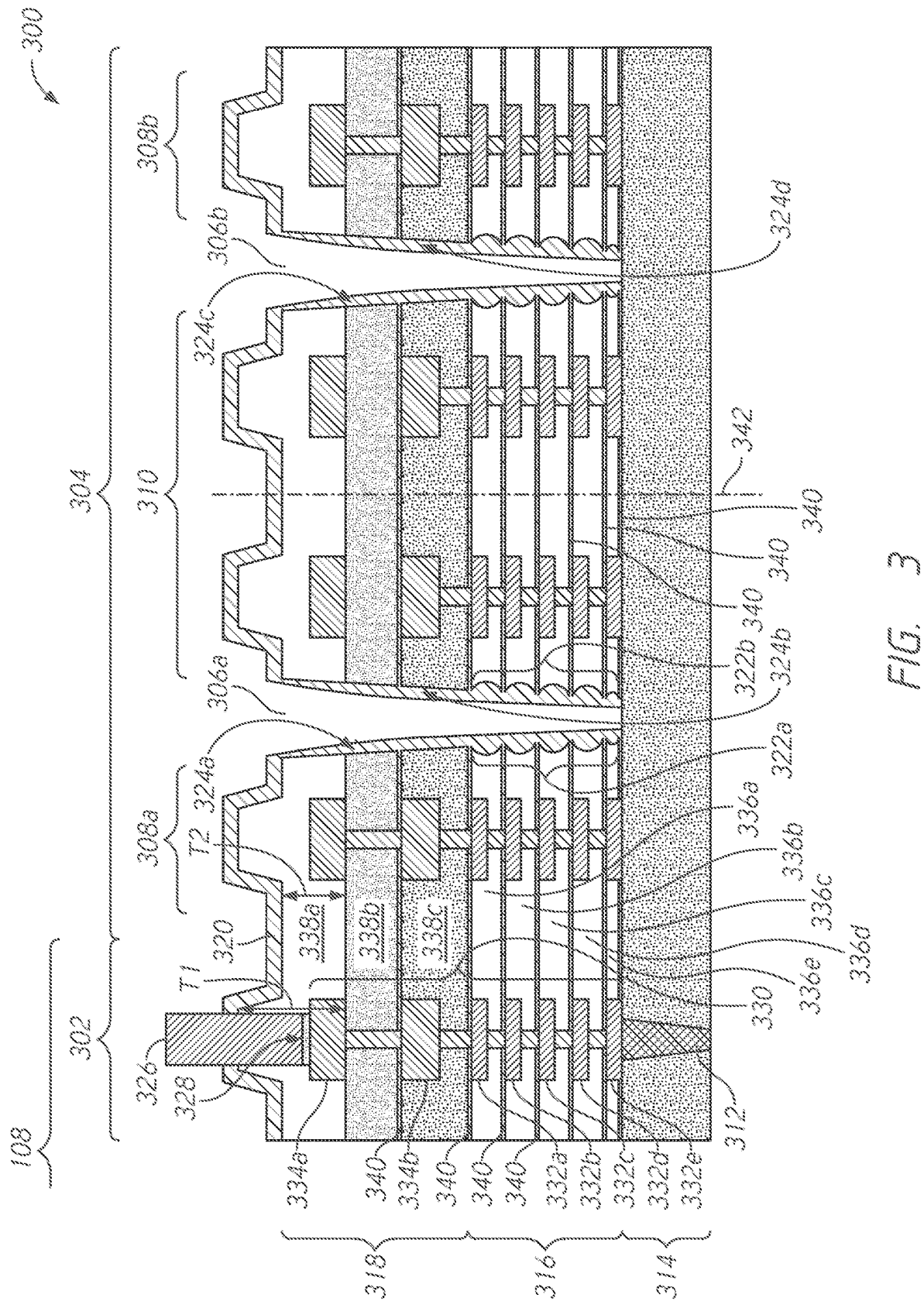
FIG. 3 is a diagram of a vertical cross-sectional view of one schematic structure of a portion of a semiconductor device in accordance with an embodiment of the present disclosure.

FIG. 3 is a diagram of a vertical cross-sectional view of one schematic structure of a portion 300 of the semiconductor device 100 in accordance with an embodiment of the present disclosure. In some embodiments, the portion 300 of the semiconductor device 100 may be a multilayer structure. The portion 300 of the semiconductor device 100 may include a semiconductor substrate 314. The semiconductor substrate 314 may include a monocrystalline silicon substrate, for example. Alternatively, the semiconductor substrate 314 may include silicon oxide (SiO2). The portion 300 of the semiconductor device 100 may include a sub region 302 of a circuit region 108. The semiconductor substrate 314 may include a through electrode 312 in the sub region 302. The portion 300 of the semiconductor device 100 may also include dielectric layers 316 disposed on the semiconductor substrate 314. In some embodiments, the dielectric layers 316 may include dielectric films (e.g., low-k films 336a-336e) including a low-k insulating material having a lower dielectric constant (k) that exhibits weaker electric polarization between conductive components relative to other dielectric materials, such as silicon dioxide (SiO2). For example, the low-k insulating material may include silicon oxycarbide (SiOC) and/or silicon carbonitride (SiCN). The portion 300 of the semiconductor device 100 may also include dielectric layers 318 (e.g., dielectric films 338a-338c) disposed on the dielectric layers 316. In some embodiments, the dielectric layers 318 may include silicon dioxide (SiO2). The dielectric layers 318 may also include a substance such as phosphorus (P) or boron (B). The semiconductor substrate 314, the dielectric layers 316 and 318 may be insulated from one another by dielectric layers 340 disposed between the adjacent dielectric layers 316 and 318, and the semiconductor substrate 314 and the dielectric layers 316 adjacent to the semiconductor substrate 314. In some embodiments, the dielectric layers 340 may include silicon nitride (Si3N4).

The portion 300 of the semiconductor device 100 may further include a scribe region 304 disposed between the circuit region 108 and another circuit region (not shown). The sub region 302 of the circuit region 108 include conductive wires 332a-332e disposed in the dielectric films 336a-336e, respectively. In some embodiments, the conductive wires 332a-332e may include copper (Cu). The sub region 302 of the circuit region 108 may also include conductive wires 334a and 334b disposed in the dielectric films 338a and 338c in the dielectric layers 318, respectively. In some embodiments, the conductive wires 334a and 334b may include aluminum (Al). The portion 300 of the semiconductor device 100 may include an interconnect 330 disposed in the sub region 302 of the circuit region 108. The interconnect 330 may include through electrodes, each disposed through two adjacent layers of the dielectric layers 316 and 318, and the dielectric layer 340 between the two adjacent layers. The interconnect 330 may couple (e.g., electrically connect) the conductive wires 332a-332e and the conductive wires 334a and 334b to the through electrode 312. In some embodiments, another interconnect may be further disposed in circuit edge 308a and circuit edge 308b and/or the scribe center region 310 of the portion 300 of the semiconductor device 100. In some embodiments, the other interconnect may be included in test circuits (not shown) disposed in the circuit edges 308a and circuit edge 308b and/or the scribe center region 310.

The portion 300 of the semiconductor device 100 may further include a cover layer 320 above one of the dielectric layers 318. In some embodiments, the cover layer 320 may be a dielectric layer including silicon nitride (Si3N4) and/or silicon carbide (SiC). The cover layer 320 and the dielectric layers 340 may prevent diffusion of the conductive material (e.g., copper diffusion). The cover layer 320 may include holes in the sub region 302 of the circuit region 108. The portion 300 of the semiconductor device 100 may further include conductive seed layer 328 in the holes in the dielectric layers 318. The conductive seed layer 328 is on the conductive wire 334a. The conductive seed layer 328 may be at an end of the interconnect 330, opposite to another end of the interconnect 330 that is on the semiconductor substrate 314. The portion 300 of the semiconductor device 100 may also include a conductive pillar 326 through the cover layer 320 and the dielectric film 338a that is a top layer of dielectric layers 318. The conductive pillar 326 may be disposed on the conductive seed layer 328 in the sub region 302 of the circuit region 108. In some embodiments, the conductive pillar 326 may include conductive material, such as copper (Cu) or nickel (Ni). The interconnect 330 may couple the conductive pillar 326 and the conductive wires 334a-334b and 332a-332e to the through electrode 312. In some embodiments, a portion of the dielectric layer 318 beneath the cover layer 320 including the conductive wire 334a may have a thickness T1 greater than a thickness T2 of the portion of the dielectric layer 318 between the circuit edge 308a and the conductive pillar 326 in the same cross-section. In some embodiments, the portion of the dielectric layer 318 having the greater thickness may include the conductive pillar 326. In some embodiments, the portion of the dielectric layer 318 having the greater thickness may be in the circuit edge 308a. The thicker portion of the dielectric layer 318 may provide support for the sub region 302 and the scribe region 304 including the interconnect 330, suppressing cracks around the interconnects in the sub region 302 and the circuit edge 308a.

The scribe region 304 may include circuit edges 308a and 308b of adjacent circuit regions, such as the circuit region 108 including the sub region 302 and the other circuit region (not shown). The scribe region 304 may also include a scribe center region 310 between the circuit edges 308a and 308b. In some embodiments, a dicing line 342 may be provided in the center of the scribe center region 310. The scribe region 304 may also include grooves 306a and 306b. In some embodiments, dicing lines may be provided in the centers of the grooves 306a and 306b. The grooves 306a and 306b may prevent the force of dicing in the scribe center region 310 or in the grooves 306a and 306b from causing and propagating cracks in the various layers. In some embodiments, the portion 300 of the semiconductor device 100 may include one or more liners 324a-324d disposed in the grooves 306a and 306h that cover at least a portion of edge surfaces of the dielectric layers 316 and 318 facing the grooves 306a and 306b, respectively. Each of the liners 324a-324d may include a dielectric layer, including silicon nitride (Si3N4) and/or silicon carbide (SiC), for example. The liners 324a and 324b in the groove 306a may cover portions 322a and 322b of edge surfaces of the dielectric layers 316 and 318 facing the groove 306a. In some embodiments, the portions 322a and 322b may include concave portions in the edge surfaces of the dielectric films 336a-336e facing the groove 306a. Each concave portion of the concave portions in the portions 322a and 322b may correspond to each of the dielectric films 336a-336e between the dielectric layers 340 above and below each dielectric film.

Processes of providing the grooves 306a and 306b, the liners 324a-324d and the conductive pillar 326 of the portion 300 of the semiconductor device 100 in accordance with various embodiments of the present disclosure will be described with reference to FIGS. 4 to 8B. A semiconductor substrate 314, dielectric layers 316 and 318 disposed on the semiconductor substrate 314, conductive wires 332a-332e and 334a-334b, the through electrodes 312 and interconnects 330 coupling the conductive wires 332a-332e and 334a-334b to the through electrodes 312 in FIGS. 4 to 8B have similar structures as the semiconductor substrate 314, the dielectric layers 316 and 318, the conductive wires 332a-332e and 334a-334b, the through electrode 312 and the interconnect 330 in FIG. 3. Thus the description of the structures of the semiconductor substrate 314, the dielectric layers 316 and 318, the conductive wires 332a-332e and 334a-334b, the through electrode 312 and the interconnect 330 is omitted for brevity.

Figure 4:
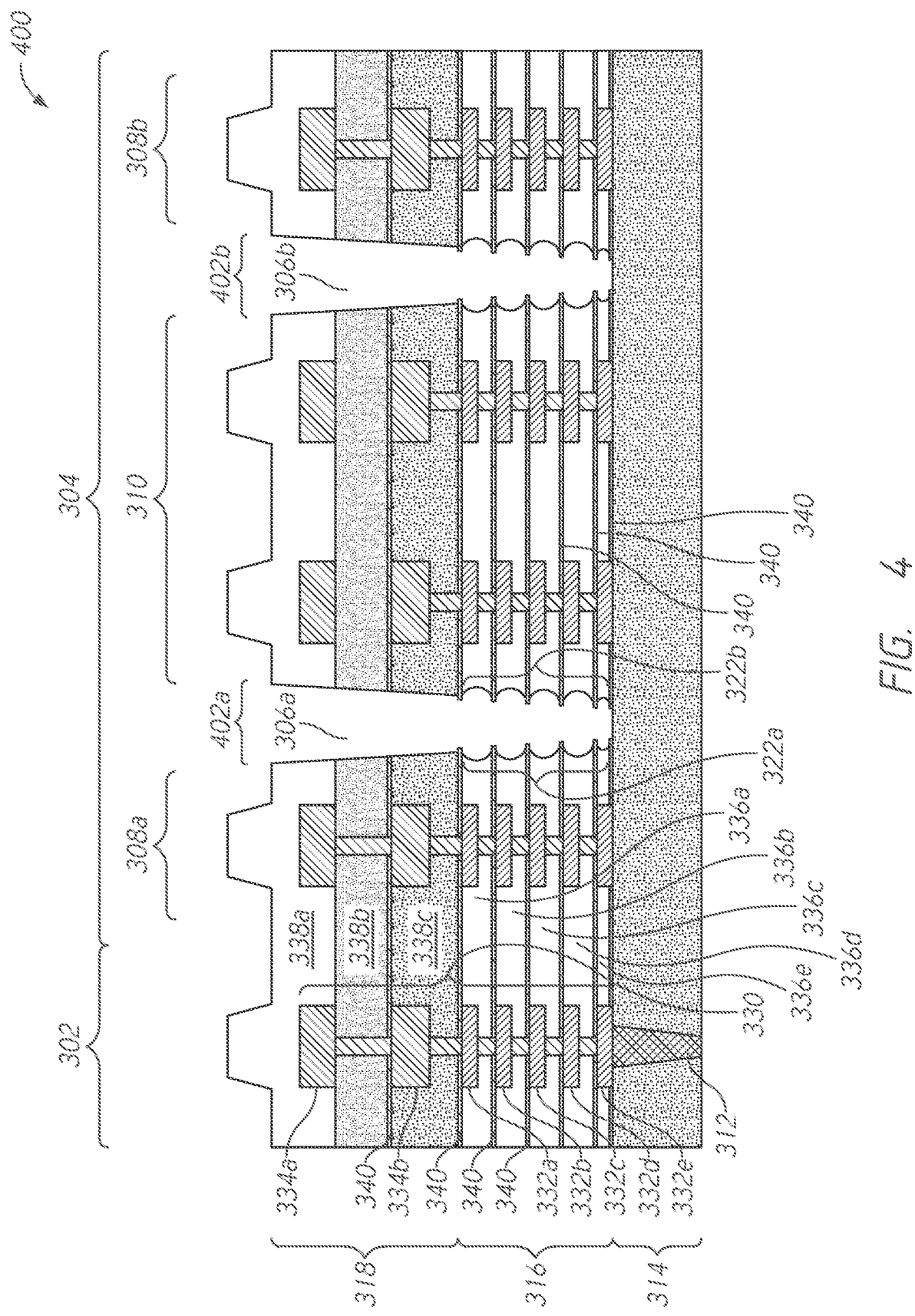
FIG. 4 is a diagram of a vertical cross-sectional view of one schematic structure of a portion of a semiconductor device in accordance with an embodiment of the present disclosure.

FIG. 4 is a diagram of a vertical cross-sectional view of one schematic structure of a portion 400 of the semiconductor device 100 in accordance with an embodiment of the present disclosure. FIG. 4 may be a cross-sectional view of the portion 400 of the semiconductor device 100 after etching for formation of grooves 306a and 306b in FIG. 3. The grooves 306a and 306b may be formed by photolithography and etching. Before etching processes (not shown), cut regions 402a and 402b may include the semiconductor substrate 314 and the dielectric layers 316 and 318. For example, one of the dielectric layers 340 may be formed on the semiconductor substrate 314. Each of the dielectric layers 316, such as dielectric films 336a-336e including low-k material, and each of dielectric layers 340 may be formed repeatedly in turn while conductive wires 332a-332e and through electrodes coupling the conductive wires 332a-332e may be formed through the dielectric layers 316 and the dielectric layers 340. In some embodiments, the dielectric layers 316 including low-k material films are formed by a chemical vapor deposition (CVD) method, for example. Dielectric layers 318, such as dielectric layers 338a-338c including silicon dioxide (SiO2) and each of dielectric layers 340 may be formed may be formed repeatedly above the dielectric layers 316 while conductive wire 334a and 334b and through electrodes coupling the conductive wire 334a to the conductive wire 334b may be formed through the dielectric layers 318. In some embodiments, the sub region 302 and the circuit edge 308a of the dielectric film 338a including the wire 334a may have a thickness greater than regions of the dielectric film 338a between the sub region 302 and the circuit edge 308a. In some embodiments, some regions in the scribe center region 310 including wires and interconnects may have a thickness greater than a center region including a dicing line between the regions including the interconnects. The thicker portions of the dielectric film 338a may provide support for the portion 400 including an interconnects 330, suppressing cracks around the interconnects 330 in the sub region 302 and the regions including interconnects in the scribe center region 310. In order to form the grooves 306a and 306b by etching, photographic processes can be used to provide patterns of grooves 306a and 306b above the dielectric film 338a. A photoresist (not shown) may be disposed to cover the circuit regions 108 and the circuit edges 308a and 308b and the scribe center region 310 of the scribe region 304 above the dielectric film 338a. In some embodiments, the photoresist may be a positive-tone photoresist that may be removed by exposure to light, such as ultraviolet (UV) light. The photoresist may not cover the cut regions 402a and 402b and thus the cut regions 402a and 402b may be exposed for etching. Etching may be dry etching or wet etching. Thus, the dielectric layers 316 and 318 in the cut regions 402a and 402b may be removed and the grooves 306a and 306b may be formed in the cut regions 402a and 402b. In some embodiments, dry etching may be performed until the etching is stopped by the semiconductor substrate 314. Thus, the grooves 306a and 306b may be disposed on or above the semiconductor substrate 314. The photoresist above the dielectric film 338a may be removed, and the cover layer 320 on the sub region 302, circuit edges 308a and 308b and the scribe center region 310 may be exposed. The groove 306a may have edge surfaces including portions 322a and 322b of the dielectric films 336a-336e facing the groove 306a as shown in FIG. 4. The portions 322a and 322b may include concaves that may be caused during the etching and post-etching processes to remove the photoresist (e.g., dry ashing and wet cleansing).

Figure 5:
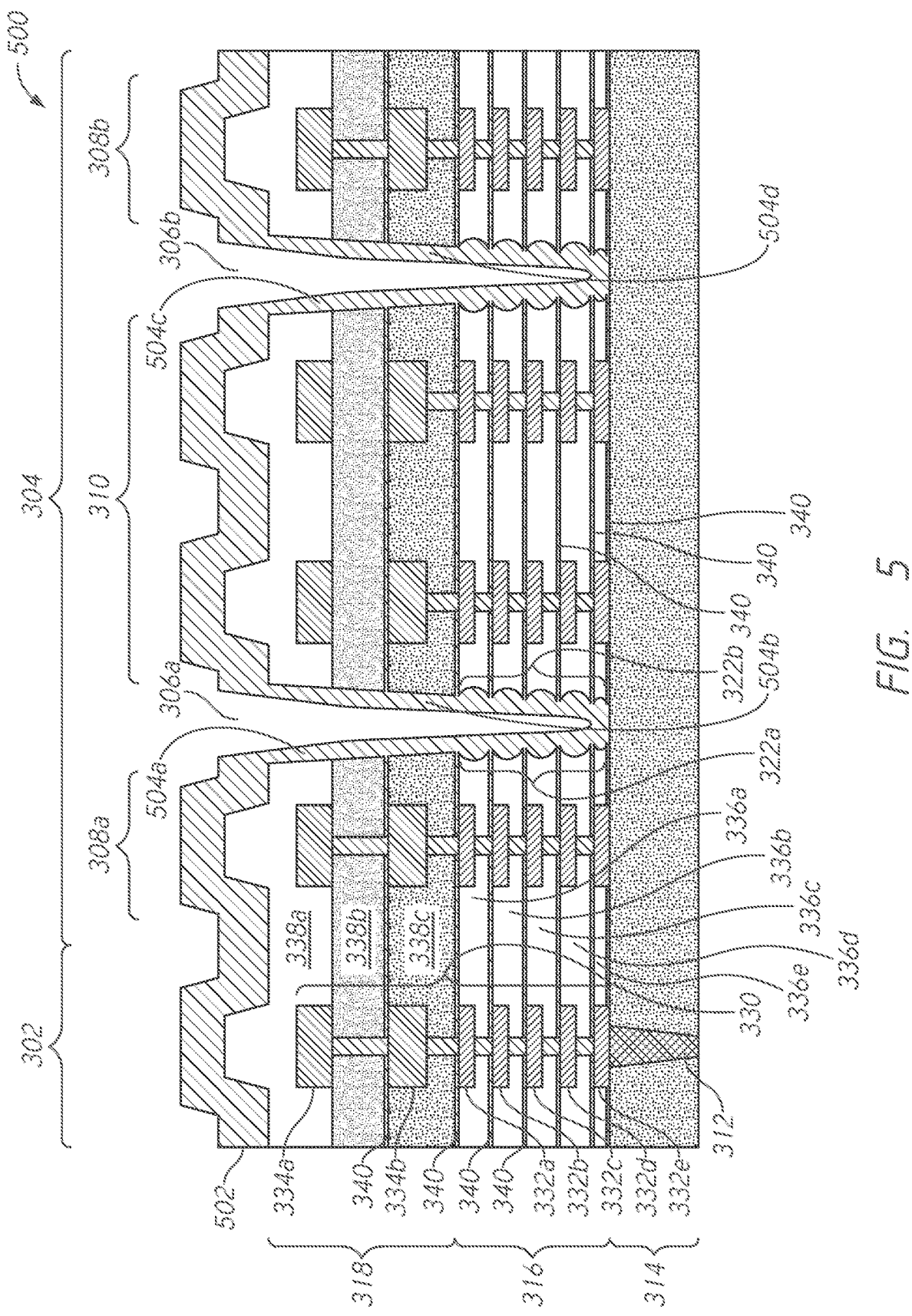
FIG. 5 is a diagram of a vertical cross-sectional view of one schematic structure of a portion of a semiconductor device in accordance with an embodiment of the present disclosure.

Roughness of surfaces of liners facing grooves may be controlled by applying dielectric material thickly. FIG. 5 is a diagram of a vertical cross-sectional view of one schematic structure of a portion 500 of the semiconductor device 100 in accordance with an embodiment of the present disclosure. FIG. 5 may be a cross-sectional view of the portion 500 of the semiconductor device 100 after deposition of dielectric material 502 above the dielectric film 338a and on edge surfaces of the dielectric layers 316 and 318 in the grooves 306a and 306b. In some embodiments, the dielectric material 502 may be, for example, silicon nitride (Si3N4) and/or silicon carbide (SiC). The dielectric material 502 may cover the top surface of the dielectric film 338a and edge surfaces of the dielectric layers 316 and 318 facing the grooves 306a and 306b, respectively, including portions 322a and 322b of the edge surfaces of the dielectric layers 318 facing the groove 306a. In some embodiments, the dielectric material 502 may be applied using a CVD method. The dielectric material 502 may be applied to be thick enough to reduce Roughness of surfaces of liners 504a-504d facing the grooves 306a and 306b. For example, the liners 504a-504d may be thicker than the cover layer 320 or the liners 324a-324d.

Figure 6A:
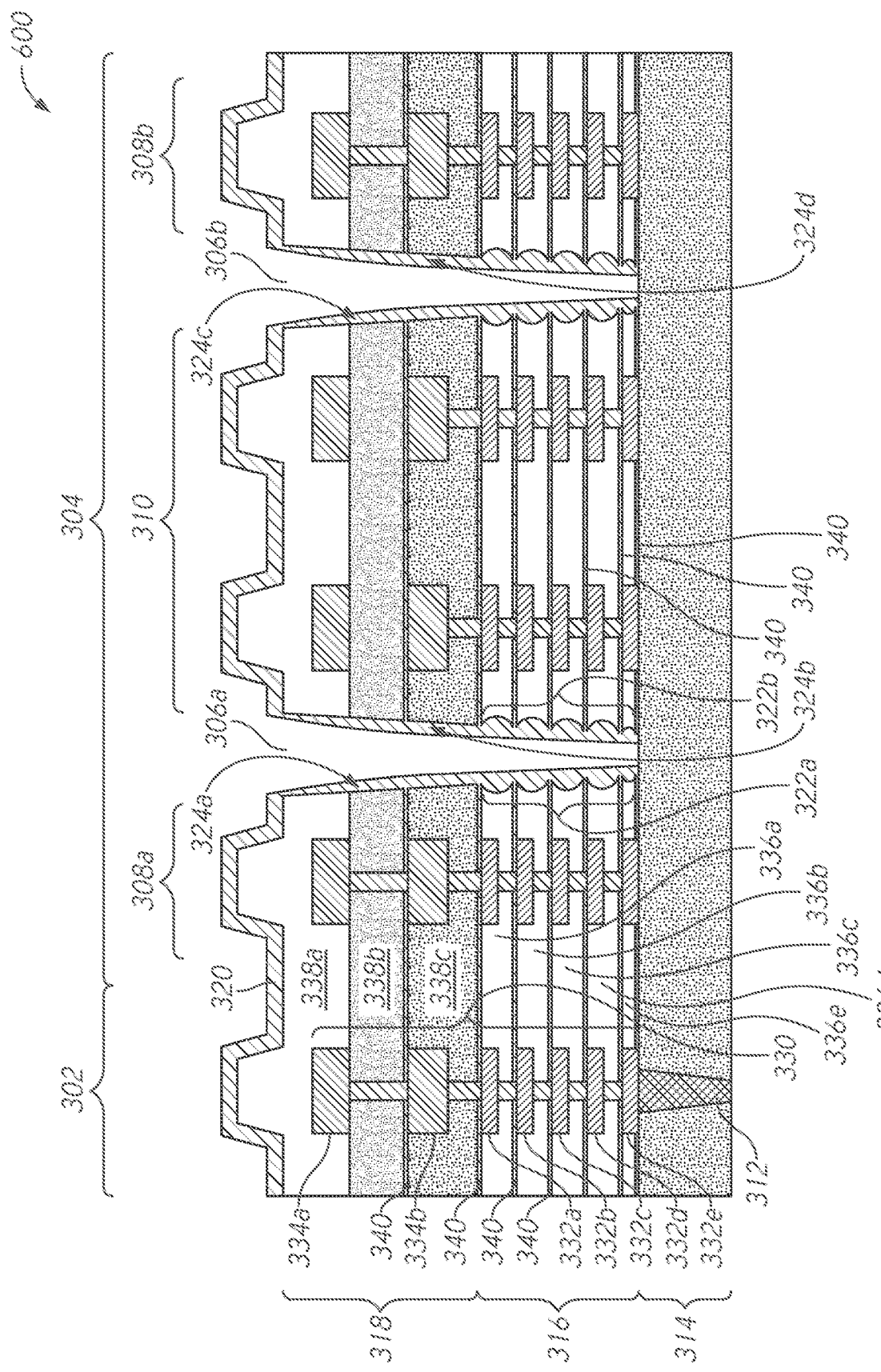
FIG. 6A is a diagram of a vertical cross-sectional view of one schematic structure of a portion of a semiconductor device in accordance with an embodiment of the present disclosure.

Roughness of surfaces of liners facing grooves may be further controlled by removing the surfaces having roughness from the liners. In some embodiments, a period of etching (e.g., dry etching) may be controlled. FIG. 6A is a diagram of a vertical cross-sectional view of one schematic structure of a portion 600 of the semiconductor device 100 in accordance with an embodiment of the present disclosure. In some embodiments, a top portion of the dielectric material 502 and the uneven surfaces of liners 504a-504d facing the grooves 306a and 306b may be removed. Thus, the cover layer 320 may be formed above the dielectric film 338a, and the liners 324a-324d covering edge surfaces of the dielectric layers 316 and 318 continuous to the cover layer 320 may be formed in the grooves 306a and 306b. The dialectic material 502 at the bottoms of the grooves 306a and 306b may be removed, and the semiconductor substrate 314 at the bottoms of the grooves 306a and 306b may be exposed.

Figure 6B:
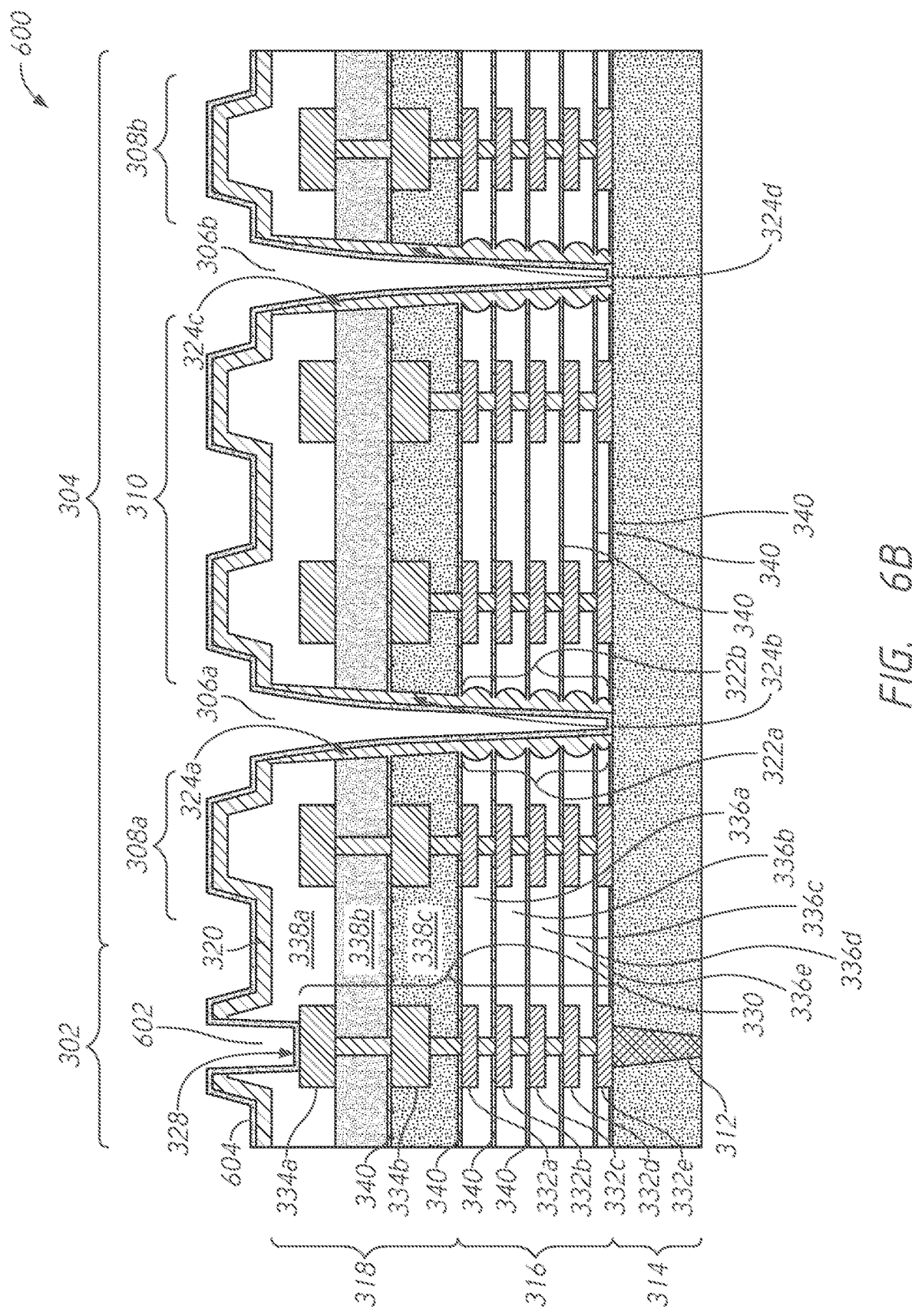
FIG. 6B is a diagram of a vertical cross-sectional view of one schematic structure of the portion of the semiconductor device in accordance with an embodiment of the present disclosure.

FIG. 6B is a diagram of a vertical cross-sectional view of one schematic structure of the portion 600 of the semiconductor device 100 in accordance with an embodiment of the present disclosure. The cover layer 320 can be patterned using photolithography. A photoresist (not shown), such as positive-tone photoresist may be applied on the cover layer 320. A mask (not shown) is provided above the photoresist. The mask may include an opening above the interconnect 330. The portion 600 under the opening may be exposed to UV light from above to remove the photoresist under the opening. Further, etching (e.g., dry etching) may be performed to provide a hole 602 through the dielectric film 338a. The hole 602 may be disposed above the interconnect 330. In some embodiments, etching may be performed until exposing the conductive wire 334a on an end of the interconnect 330 in the dielectric film 338a. The photoresist may be removed in post-etching processes (e.g., dry ashing and wet cleansing).

After removing the photoresist, barrier and conductive seed layer 604 may be deposited to cover the cover layer 320, the hole 602 and the grooves 306a and 306b. In some embodiments, the barrier and conductive seed layer 604 may be deposited by a physical vapor deposition (PVD) method, such as sputtering. The barrier and conductive seed layer 604 may include a barrier film and a conductive seed film. The barrier and conductive seed layer 604 may cover the hole 602, including edge surfaces and bottom of the hole 602. The barrier and conductive seed layer 604 may include the conductive seed layer 328 on the exposed conductive wire 334a at the bottom of the hole 602. As illustrated in FIG. 6B, the dielectric layers 316 and 318 may have edge surfaces facing the grooves 306a and 306b. The portions of the edge surfaces of the dielectric layers 316 and 318, including portions 322a and 322b in the dielectric layers 316, up to the dielectric film 338b may be covered by the liners 324a and 324b. The liner 324a may cover the portion 322a that includes the concave portions of the edge surfaces of the dielectric layers 316. The liner 324a may further cover the edge surfaces of the dielectric layers 318 facing the groove 306a that is continuous with the cover layer 320. Similarly, the liner 324b may cover the edge surfaces of the dielectric layers 316 and 318 facing the groove 306a, including the portion 322b. Thus, the top surfaces of the liner 324a-324d and the top surface of the cover layer 320 may be covered by the barrier and conductive seed layer 604. Because the liners 324a and 324b having less uneven surfaces compared to the portions 322a and 322b, the barrier and conductive seed layer 604 may be deposited on a top surface of the portion 600 in a continuous and seamless manner. Thus, the conductive pillar 326 in FIG. 3 may be successfully formed by electroplating on the conductive seed layer 328.

In some embodiments, liners may cover edge surfaces lower dielectric films (e.g., low-k films) having roughness, facing grooves without covering the edge surfaces of upper dielectric films in the grooves above the lower dielectric films.

Figure 7:
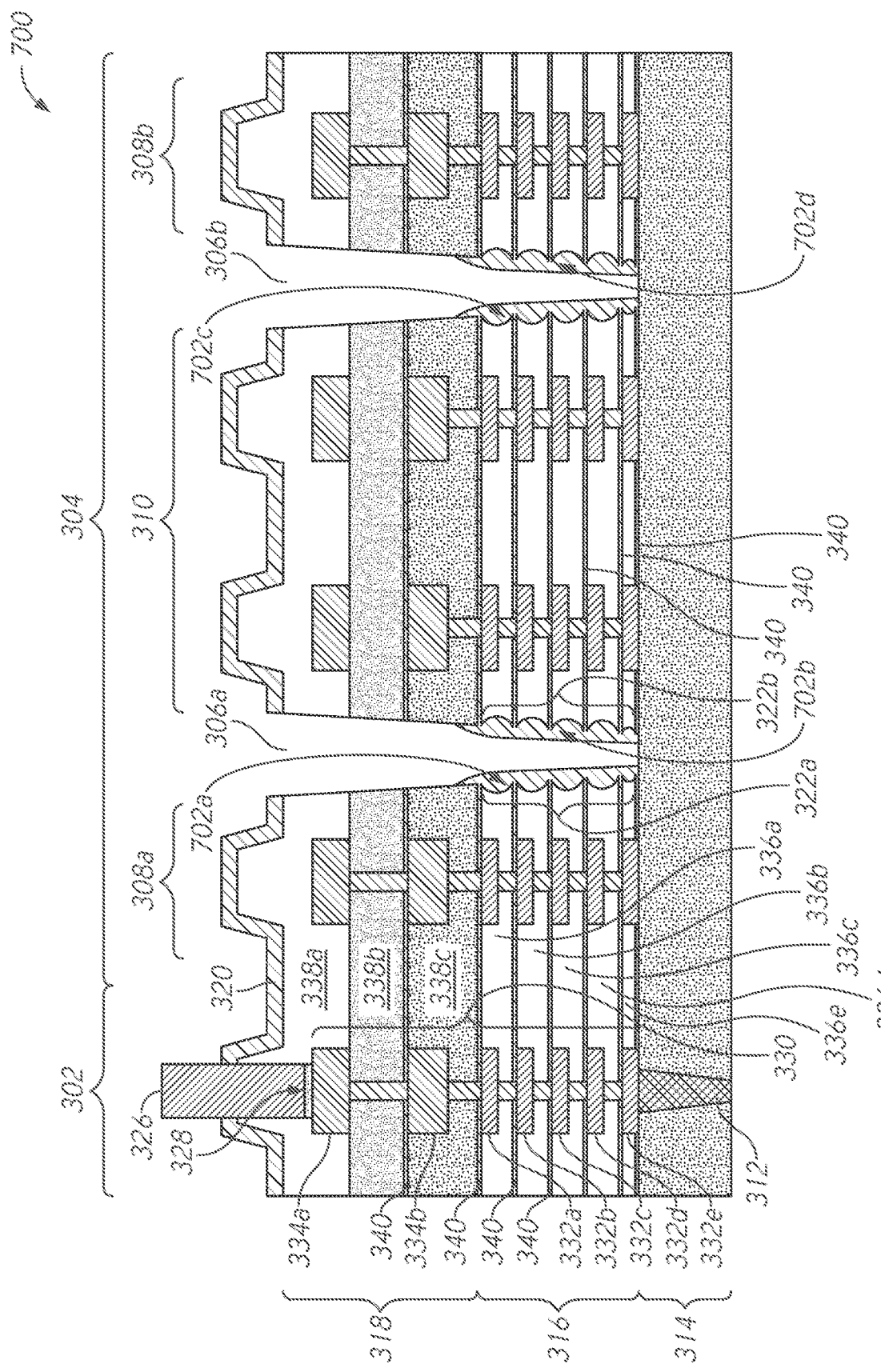
FIG. 7 is a diagram of a vertical cross-sectional view of one schematic structure of a portion of a semiconductor device in accordance with an embodiment of the present disclosure.

FIG. 7 is a diagram of a vertical cross-sectional view of one schematic structure of a portion 700 of the semiconductor device 100 in accordance with an embodiment of the present disclosure. The semiconductor substrate 314, the dielectric layers 316 and 318 and the cover layer 320, the sub region 302 and the scribe region 304 in FIGS. 7 to 8 have similar structures as the semiconductor substrate 314, the dielectric layers 316 and 318 and the cover layer 320, the sub region 302 and the scribe region 304 in FIG. 3. Thus the description of the structures of the semiconductor substrate 314, the dielectric layers 316 and 318 and the cover layer 320, the sub region 302 and the scribe region 304 is omitted for brevity.

In some embodiments, the portion 700 of the semiconductor device 100 may include one or more liners 702a-702d disposed in the grooves 306a and 306b respectively, that cover at least a portion of edge surfaces of the dielectric layers 316. For example, the liners 702a-702d may include dielectric material, such as silicon nitride (Si3N4) and/or silicon carbide (SiC). In some embodiments, portions 322a and 322b of the edge surfaces of the dielectric layers 316 in the groove 306a may include concave portions of the dielectric films 336a-336e facing the groove 306a. The liners 702a-702d may cover the edge surfaces of the dielectric layers 316. For example, the liners 702a and 702b in the groove 306a may cover the portions 322a and 322b. The liners 702a-702d may not cover the edge surfaces of the dielectric layers 318 facing the grooves 306a and 306b. For example, in some embodiments, one or more of the layers 338 of the dielectric layers 318 may remain exposed by the liners 702a-702d.

Figure 8A:
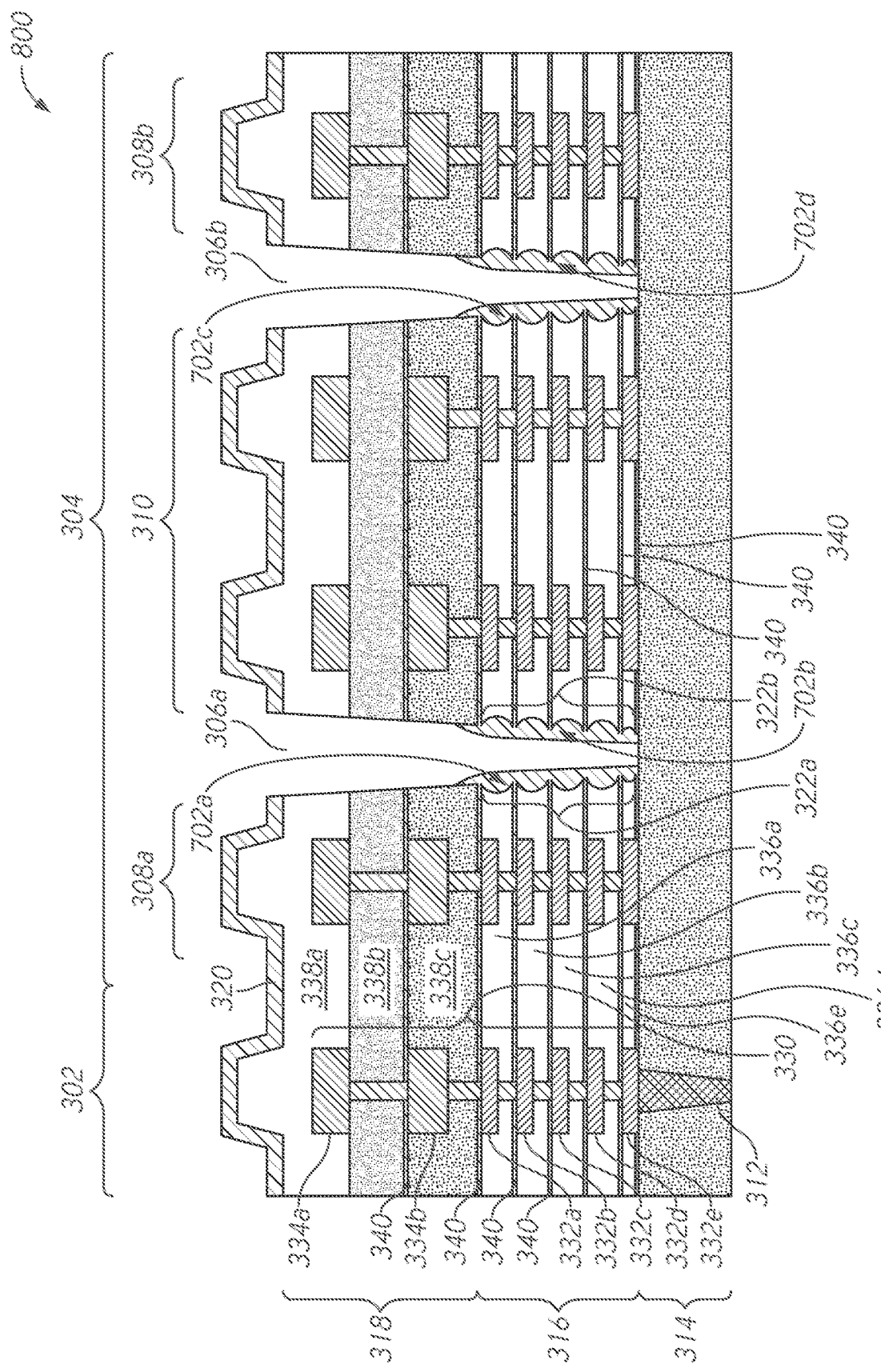
FIG. 8A is a diagram of a vertical cross-sectional view of one schematic structure of a portion of a semiconductor device in accordance with an embodiment of the present disclosure.

Roughness of surfaces of liners facing grooves may be further controlled by removing the surfaces from liners. In some embodiments, a period of etching (e.g., dry etching) may be controlled. FIG. 8A is a diagram of a vertical cross-sectional view of one schematic structure of a portion 800 of the semiconductor device 100 in accordance with an embodiment of the present disclosure. In some embodiments, a top portion of the dielectric material 502 and the uneven surfaces of liners 504a-504d facing the grooves 306a and 306b may be removed by etching that is performed for a period longer than the etching performed to form the liners 324a-324d. Thus, portions of the liners 324a-324d covering the edge surfaces of at least a portion of the dielectric layers 318 facing the grooves 306a and 306b may also be removed. As a result, the liners 702a-702d covering the edge surfaces of the dielectric layers 316 may be formed. The liners 702a and 702b may cover the portions 322a and 322b that include the concave portions of the edge surfaces of the dielectric layers 316. The liners 702a-702d may not cover the edge surfaces of the dielectric layers 318 facing the grooves 306a and 306b. In some embodiments, the liners 702a and 702b may be continuous (e.g., without a plurality of concave portions). In some embodiments, the surfaces of the liners 702a and 702b may be smoother than portions 322a and 322b of the edge surfaces of the dielectric layers 316.

Figure 8B:
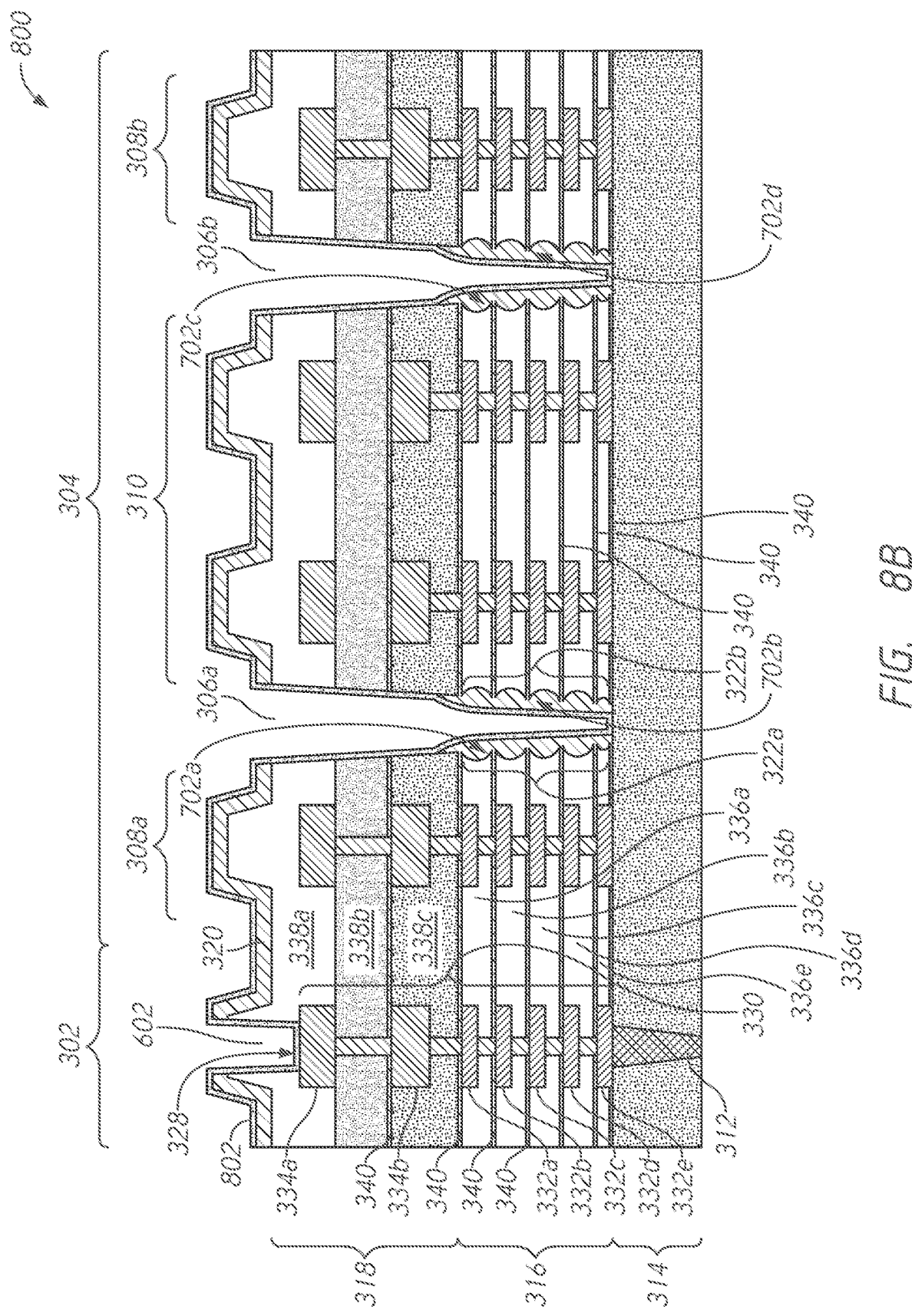
FIG. 8B is a diagram of a vertical cross-sectional view of one schematic structure of the portion of the semiconductor device in accordance with an embodiment of the present disclosure.

FIG. 8B is a diagram of a vertical cross-sectional view of one schematic structure of the portion 800 of the semiconductor device 100 in accordance with an embodiment of the present disclosure. Patterning the cover layer 320 using photolithography and etching to provide the hole 602 may be similar to patterning the cover layer 320 and etching to provide the hole 602 previously described with reference to and shown in FIG. 7B, thus the description of patterning and etching to provide the hole is omitted for brevity.

After providing the hole 602, barrier and conductive seed layer 802 may be deposited to cover the cover layer 320, the hole 602 and the grooves 306a and 306b. Deposition methods and materials of the barrier and conductive seed layer 802 may be similar to the deposition methods and the materials of the barrier and conductive seed layer 604 thus the description of the deposition methods and the materials of the barrier and conductive seed layer 802 is omitted for brevity. The barrier and conductive seed layer 802 may cover the hole 602, including edge surfaces and bottom of the hole 602. The barrier and conductive seed layer 802 may include the conductive seed layer 328 at the bottom of the hole 602. The conductive seed layer 328 may be disposed on the exposed conductive wire 334a. The barrier and conductive seed layer 802 may be also disposed in the grooves 306a and 306b. In some embodiments, the barrier and conductive seed layer 802 may cover the liners 702a-702d and the edge surfaces of the dielectric layers 318 facing the grooves 306a and 306b in a continuous manner. The liners 702a-702d may provide surfaces, on which the barrier and conductive seed layer 802 may be deposited continuously and seamlessly. Thus, the conductive pillar 326 in FIG. 7 may be successfully formed by electroplating on the conductive seed layer 328.

In some embodiments, liners and a dielectric film of dielectric layers below a cover layer and may include dielectric material in common, such as silicon dioxide (SiO2). In some embodiments, liners may cover edge surfaces having roughness of lower dielectric films (e.g., low-k films) facing grooves without covering the edge surfaces of upper dielectric films in the grooves above the lower dielectric films.

Figure 9:
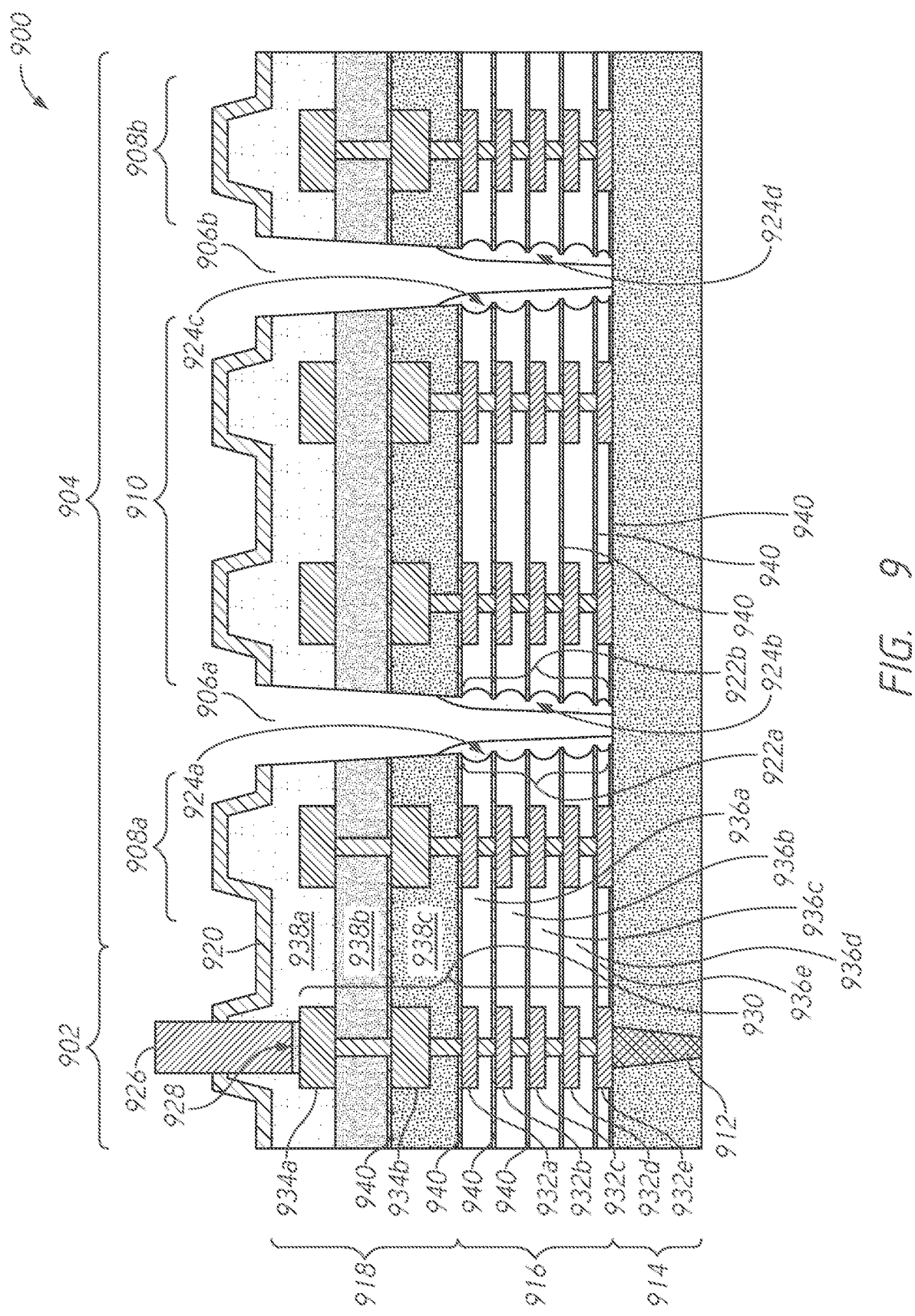
FIG. 9 is a diagram of a vertical cross-sectional view of one schematic structure of a portion of a semiconductor device in accordance with an embodiment of the present disclosure.

FIG. 9 is a diagram of a vertical cross-sectional view of one schematic structure of a portion 900 of the semiconductor device 100 in accordance with an embodiment of the present disclosure. In some embodiments, the portion 900 of the semiconductor device 100 may be a multilayer structure. The multilayer structure shown in FIG. 9 may be similar to the structure previously described with reference to and shown in FIG. 3. For example, a semiconductor substrate 914, dielectric layers 916 and 918, a cover layer 920, a sub region 302 and a scribe region 904 in FIGS. 9-15 have similar structures as the semiconductor substrate 314, the dielectric layers 316 and 318 and the cover layer 320, the sub region 302 and the scribe region 304 in FIG. 3. Thus the description of the structures of the semiconductor substrate 914, the dielectric layers 916 and 918, the cover layer 920, the sub region 302 and the scribe region 904 is omitted for brevity.

In some embodiments, the portion 900 of the semiconductor device 100 may include one or more liners 924a-924d disposed in the grooves 906a and 906b, that cover at least a portion of edge surfaces of the dielectric layers 916. The dielectric layers 916 may include low-k films. The liners 924a-924d may include dielectric material, such as silicon dioxide (SiO2). In some embodiments, the edge surfaces of the dielectric layers 916 may include portions 922a and 922b. The portions 922a and 922b may include concave portions in the edge surfaces of the dielectric films 936a-936e facing the groove 906a. Each concave portion of the concave portions in the portions 922a and 922b may correspond to each of the dielectric films 936a-936e between the dielectric layers 940 above and below each dielectric film. The liners 924a-924d may cover the portions 922a and 922b. The liners 924a-924d may not cover the edge surfaces of the dielectric layers 918 facing the grooves 906a and 906b. For example, in some embodiments, one or more of the layers 938 of the dielectric layers 918 may remain exposed by the liners 924a-924d.

Figure 10:
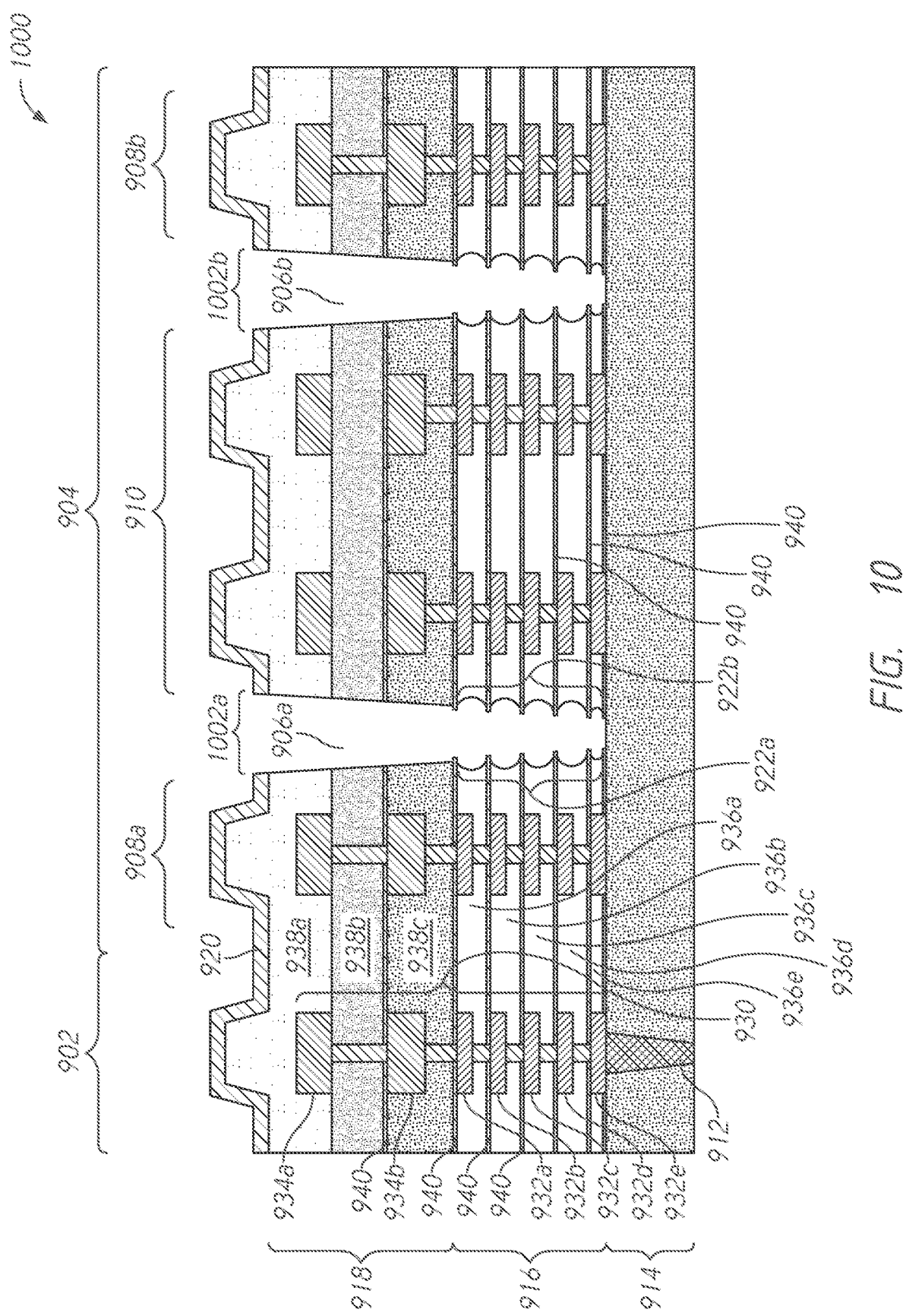
FIG. 10 is a diagram of a vertical cross-sectional view of one schematic structure of a portion of a semiconductor device in accordance with an embodiment of the present disclosure.

FIG. 10 is a diagram of a vertical cross-sectional view of one schematic structure of a portion 1000 of the semiconductor device 100 in accordance with an embodiment of the present disclosure. FIG. 10 may be a cross-sectional view of the portion 1000 of the semiconductor device 100 after etching for formation of grooves 906a and 906b in FIG. 9. The grooves 906a and 906b may be formed by photolithography and etching. Before etching processes (not shown), cut regions 1002a and 1002b may include the semiconductor substrate 914, the dielectric layers 916 and 918 and a cover layer 920. Each of the dielectric layers 916, such as dielectric films 936a-936e including low-k material, and each of dielectric layers 918, such as dielectric films 938a-938c may be formed repeatedly in turn while conductive wires 932a-932e and through electrodes coupling the conductive wires 932a-932e may be formed through the dielectric layers 916 and the dielectric layers 940. In some embodiments, the dielectric layers 916 including low-k material films are formed by a chemical vapor deposition (CVD) method, for example.

The dielectric layers 918, such as dielectric film 938a-938c including silicon dioxide (SiO2) may be formed repeatedly while conductive wire 934a and 934b and through electrodes coupling the conductive wire 934a to the conductive wire 934b may be formed through the dielectric layers 918. In some embodiments, at least a dielectric film 938a disposed as a top layer of the dielectric layers 918 may be formed as plasma enhanced tetraethyl orthosilicate (PE TEOS).

In some embodiments, the dielectric film 938a beneath the cover layer 920 including the conductive wire 934a may have a thickness greater than a thickness of the dielectric film 938a between the circuit edge 908a and the interconnect 930 in the same cross-section. The thicker portion of the dielectric film 938a may provide support for the sub region 902 and the scribe region 904 including the interconnect 930, suppressing cracks around the interconnects in the sub region 902 and the circuit edge 908a.

The cover layer 920 may be formed on the dielectric film 938a at the top of the dielectric layers 918. The grooves 906a and 906b be may be provided by photolithography and etching, removing dielectric layers 916, 918 and the cover layer 920 in cut regions 1002a and 1002b. Processes of providing the grooves 906a and 906b may be similar to providing the grooves 306a and 306b by photolithography and etching previously described with reference to and shown in FIG. 4, thus the description of photolithography and etching to provide the grooves 906a and 906b in cut regions 1002a and 1002b is omitted for brevity.

Figure 11:
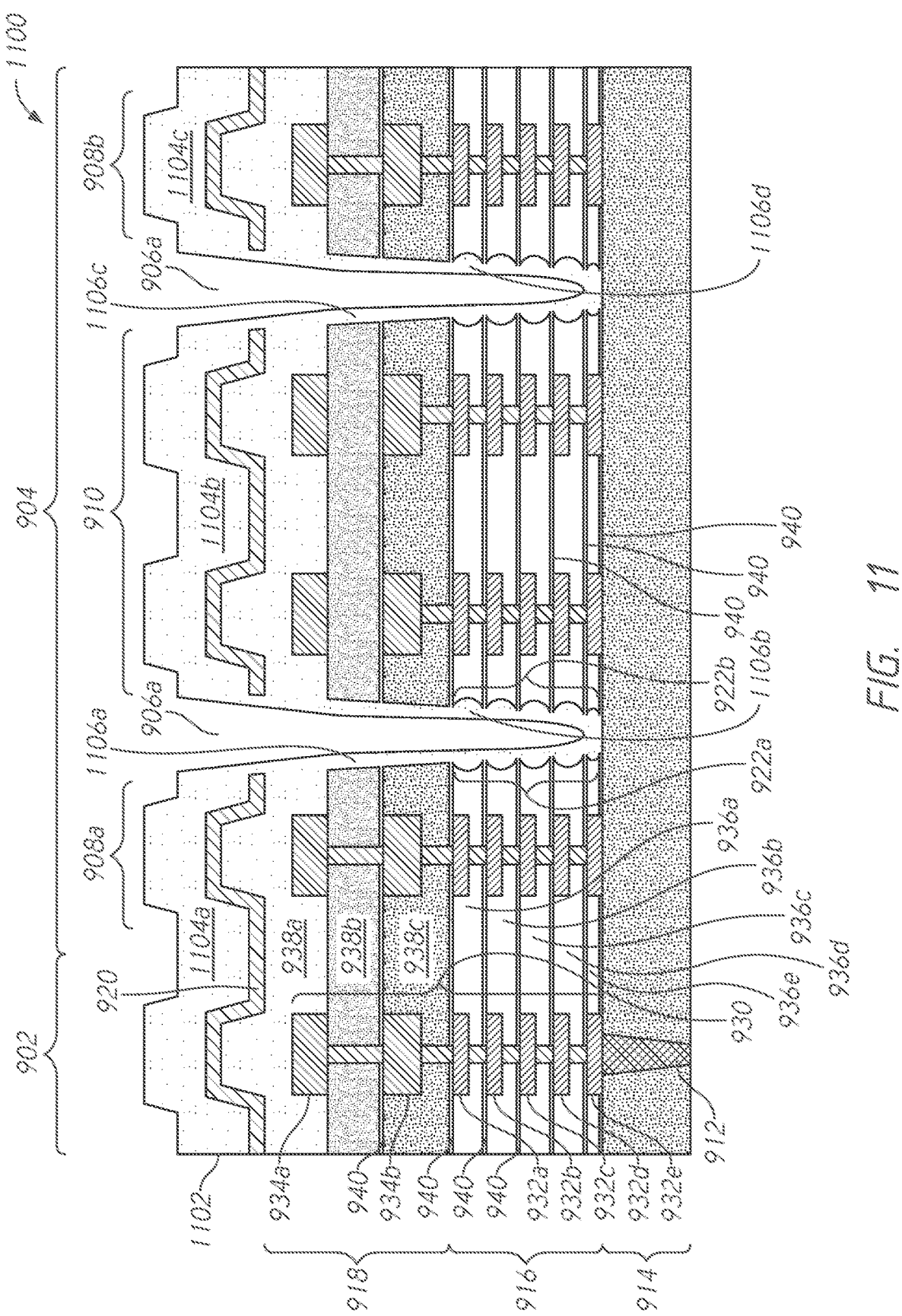
FIG. 11 is a diagram of a vertical cross-sectional view of one schematic structure of a portion of a semiconductor device in accordance with an embodiment of the present disclosure.

Roughness of surfaces of liners facing grooves may be further controlled by applying dielectric material thickly. FIG. 11 is a diagram of a vertical cross-sectional view of one schematic structure of a portion 1100 of the semiconductor device 100 in accordance with an embodiment of the present disclosure. FIG. 11 may be a cross-sectional view of the portion 1100 of the semiconductor device 100 after deposition of dielectric material 1102 above the dielectric film 938a and in the grooves 906a and 906b to form dielectric layers 1104a-1104c on the cover layer 920 and the liners 1106a-1106d in the grooves 906a and 906b. The dielectric layers 1104a-1104c may cover the entire cover layer 920. The liners 1106a-1106d may cover edge surfaces of the dielectric layers 916 and 918 facing the grooves 906a and 906b, including portions 922a and 922b of the edge surfaces of the dielectric layers 918 facing the groove 906a. In some embodiments, the dielectric material 1102 may be silicon dioxide (SiO2) formed as plasma enhanced tetraethyl orthosilicate (PE TEOS) applied using a CVD method. The dielectric material 1102 may be applied to be thick enough to reduce roughness of surfaces of liners 1106a-1106d covering the portions 922a and 922b.

Figure 12:
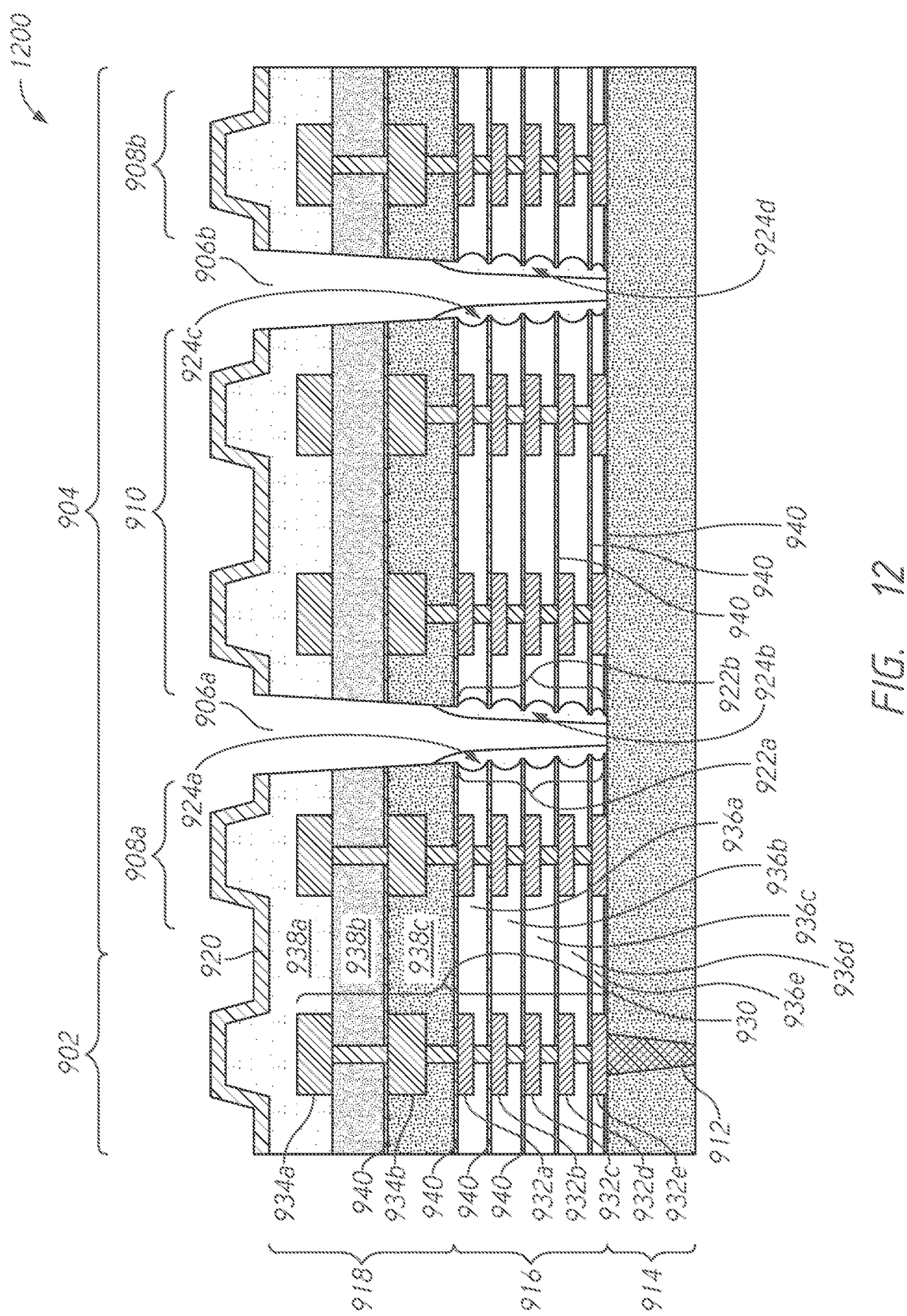
FIG. 12 is a diagram of a vertical cross-sectional view of one schematic structure of a portion of a semiconductor device in accordance with an embodiment of the present disclosure.

Roughness of surfaces of liners facing grooves may be further controlled by removing the uneven portion of the dielectric material from liners. In some embodiments, a period of etching (e.g., dry etching) may be controlled to completely remove the liners above the low-k films. FIG. 12 is a diagram of a vertical cross-sectional view of one schematic structure of a portion 1200 of the semiconductor device 100 in accordance with an embodiment of the present disclosure. In some embodiments, the dielectric layers 1104a-1104c and the uneven surfaces of liners 1106a-1106d facing the grooves 906a and 906h may be removed by etching. Thus, portions of the liners 1106a-1106d covering the edge surfaces of the dielectric layers 918 facing the grooves 906a and 906b may also be removed. As a result, the liners 924a-924d covering the edge surfaces of the dielectric layers 916 may be formed. The liners 924a and 924c may cover the portions 922a and 922b that include the concave portions of the edge surfaces of the dielectric layers 916. The liners 924a-924d may not cover the edge surfaces of the dielectric layers 918 facing the grooves 906a and 906b. In some embodiments, the liners 924a-924d may be continuous (e.g., without a plurality of concave portions). In some embodiments, the surfaces of the liners 924a and 924b may be smoother than portions 922a and 922b of the edge surfaces of the dielectric layers 916.

Figure 13:
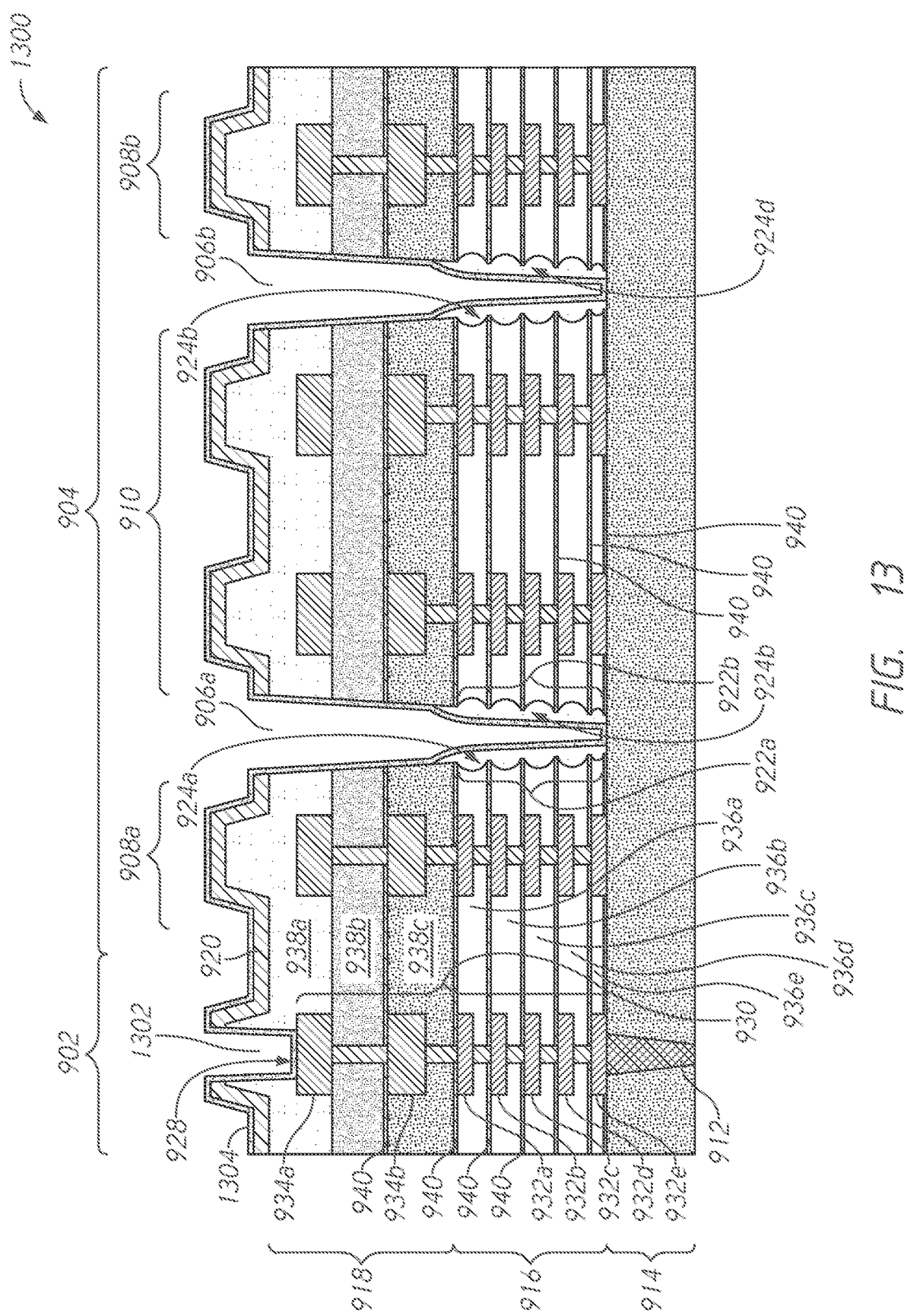
FIG. 13 is a diagram of a vertical cross-sectional view of one schematic structure of a portion of a semiconductor device in accordance with an embodiment of the present disclosure.

FIG. 13 is a diagram of a vertical cross-sectional view of one schematic structure of a portion 1300 of the semiconductor device 100 in accordance with an embodiment of the present disclosure. Patterning the cover layer 920 using photolithography and etching to provide a hole 1302 may be similar to patterning the cover layer 320 and etching to provide the hole 602 previously described with reference to and shown in FIG. 7B, thus the description of patterning and etching to provide the hole is omitted for brevity.

After providing the hole 1302, barrier and conductive seed layer 1304 may be deposited to cover the cover layer 920, the hole 1302 and the liners 924a-924d. Deposition methods and materials of the barrier and conductive seed layer 1304 may be similar to the deposition methods and the materials of the barrier and conductive seed layers 604 and 802 thus the description of the deposition methods and the materials of the barrier and conductive seed layer 1304 is omitted for brevity. The barrier and conductive seed layer 1304 may cover the hole 1302, including edge surfaces and bottom of the hole 1302. The barrier and conductive seed layer 1304 may include the conductive seed layer 928 at the bottom of the hole 1302. The conductive seed layer 928 may be disposed on the exposed conductive wire 934a. The barrier and conductive seed layer 1304 may be also disposed in the grooves 906a and 906b. In some embodiments, the barrier and conductive seed layer 1304 may cover the liners 924a-924d and the edge surfaces of the dielectric layers 918 facing the grooves 906a and 906b in a continuous manner. The liners 924a-924d may provide surfaces, on which the barrier and conductive seed layer 1304 may be deposited continuously and seamlessly. Thus, the conductive pillar 926 in FIG. 9 may be successfully formed by electroplating on the conductive seed layer 928.

Roughness of surfaces of liners facing grooves may be further controlled by removing the surfaces having roughness from liners. In some embodiments, a period of etching (e.g., dry etching) may be controlled to either remove a portion of the liners or leave the liners, including silicon dioxide (SiO2) formed as plasma enhanced tetraethyl orthosilicate (PE TEOS) as will be described in FIGS. 14-15.

Figure 14:
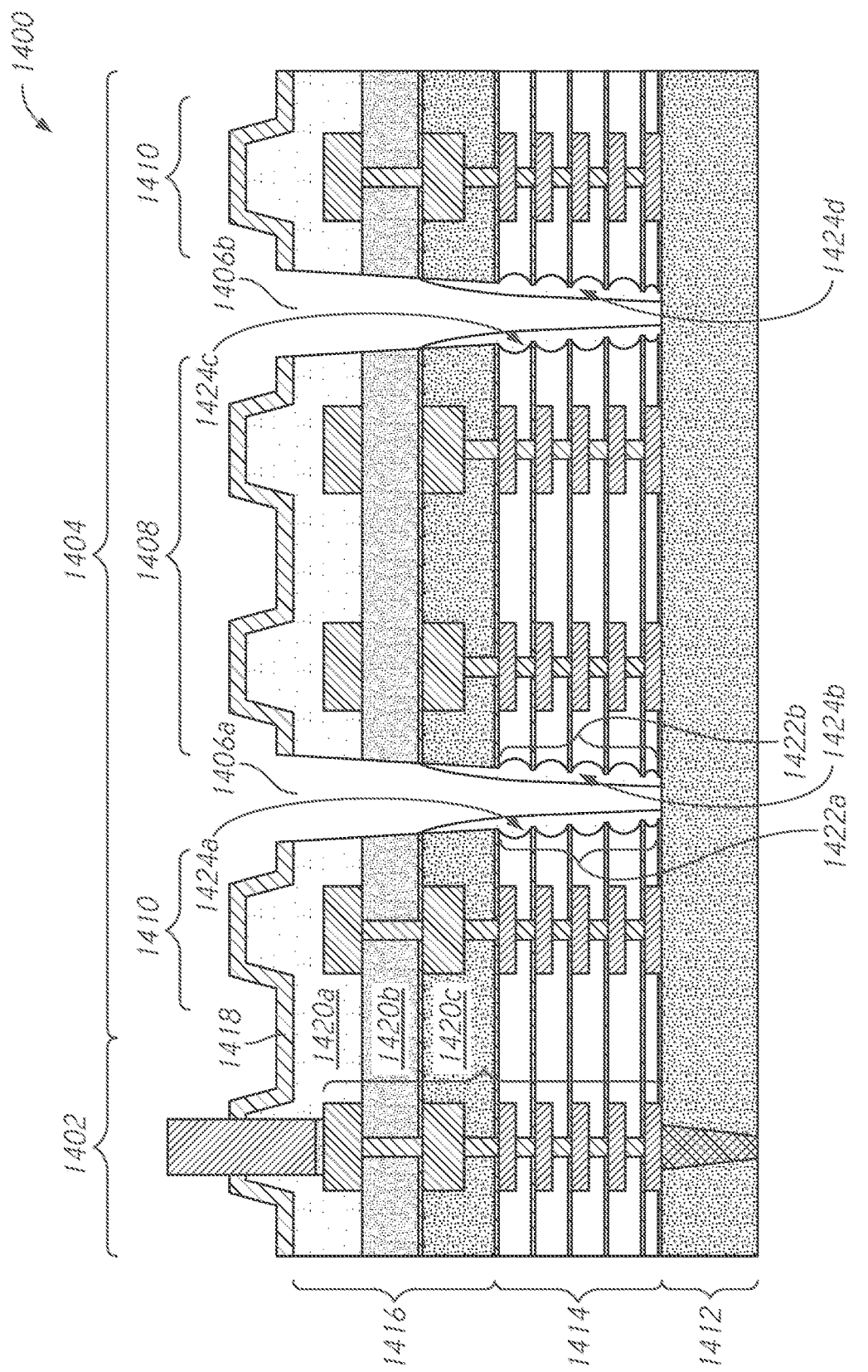
FIG. 14 is a diagram of a vertical cross-sectional view of one schematic structure of a portion of a semiconductor device in accordance with an embodiment of the present disclosure.

FIG. 14 is a diagram of a vertical cross-sectional view of one schematic structure of a portion 1400 of the semiconductor device 100 in accordance with an embodiment of the present disclosure. In some embodiments, the portion 1400 of the semiconductor device 100 may be a multilayer structure. The multilayer structure 1400 shown in FIG. 14 may be similar to the structure previously described with reference to and shown in FIG. 3. For example, a semiconductor substrate 1412, dielectric layers 1414 and 1416, a cover layer 1418, a sub region 1402 and a scribe region 1404 in FIG. 14 have similar structures as the semiconductor substrate 314, the dielectric layers 316 and 318 and the cover layer 320, the sub region 302 and the scribe region 304 in FIG. 3. Thus the description of the structures of the semiconductor substrate 1412, the dielectric layers 1414 and 1416, the cover layer 1418, the sub region 1402 and the scribe region 1404 is omitted for brevity.

In some embodiments, the portion 1400 of the semiconductor device 100 may include one or more liners 1424a to 1424d disposed in the grooves 1406a and 1406b, that cover at least a portion of edge surfaces of the dielectric layers 1414. The dielectric layers 1414 may include low-k films. The liners 1424a to 1424d may include dielectric material, such as silicon dioxide (SiO2). In some embodiments, the edge surfaces of the dielectric layers 1414 may include portions 1422a and 1422b. The portions 1422a and 1422b may include concave portions in the edge surfaces of the dielectric layers 1414 facing the groove 1406a. The liners 1424a to 1424d may cover the portions 1422a and 1422b as well as a portion of the edge surfaces of the dielectric layers 1416 facing the grooves 1406a and 1406b, such as edge surfaces of a dielectric film 1420c adjacent to the dielectric layers 1414. The liners 1424a to 1424d may not cover a portion of the edge surfaces of the dielectric layers 1416 facing the grooves 1406a and 1406b, such as edge surfaces of a dielectric film 1420a beneath the cover layer 1418. For example, in some embodiments, one or more of the layers 1420 of the dielectric layers 1416 may remain exposed by the liners 1424a-1424d. The liners 1424a to 1424d together with the edge surfaces of the dielectric film 1420a and possibly the edge surfaces of the dielectric films 1420b may provide surfaces, on which a barrier and conductive seed layer may be deposited continuously and seamlessly. Thus, a conductive pillar may be successfully formed by electroplating.

Figure 15:
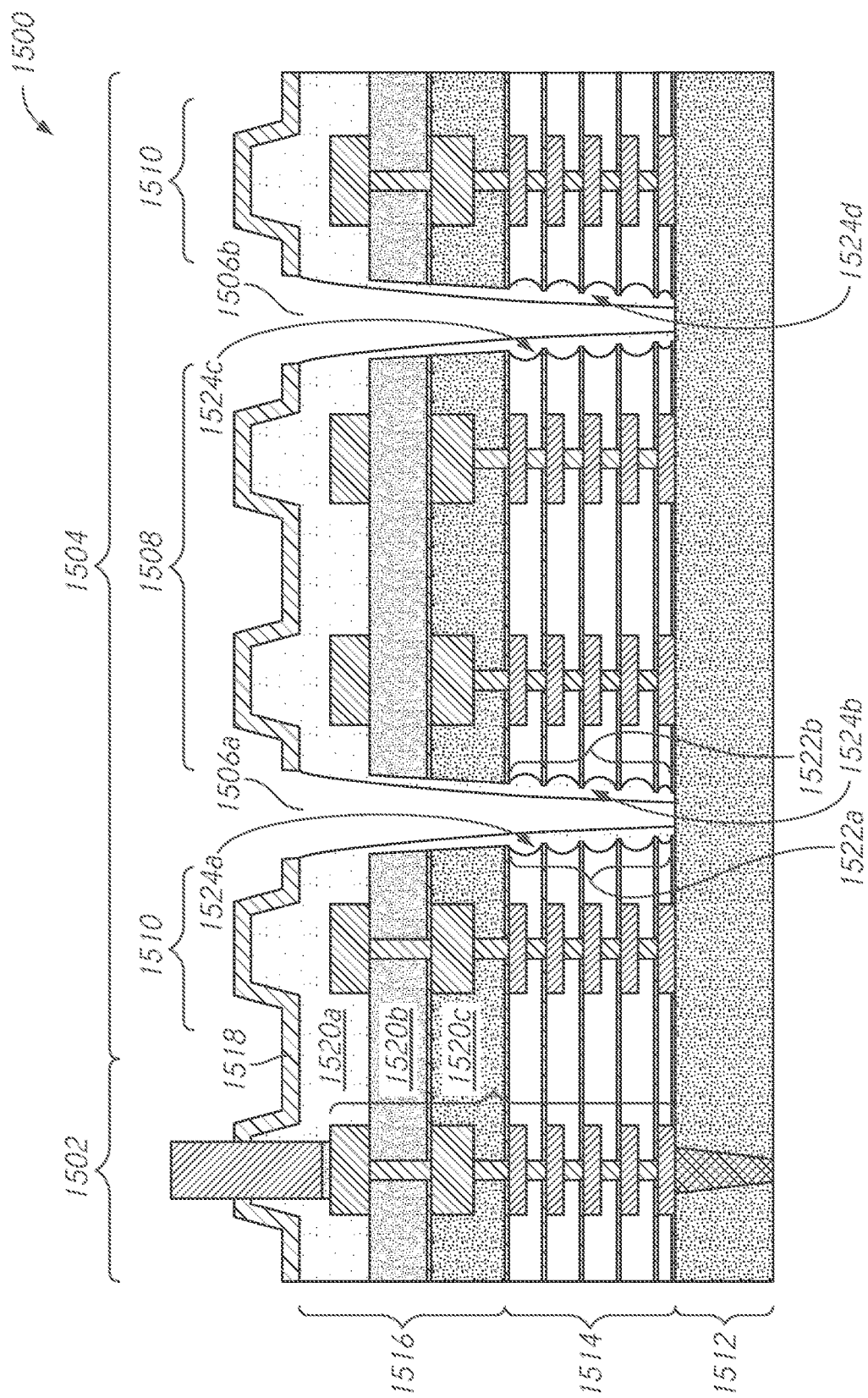
FIG. 15 is a diagram of a vertical cross-sectional view of one schematic structure of a portion of a semiconductor device in accordance with an embodiment of the present disclosure.

FIG. 15 is a diagram of a vertical cross-sectional view of one schematic structure of a portion 1500 of the semiconductor device 100 in accordance with an embodiment of the present disclosure. In some embodiments, the portion 1500 of the semiconductor device 100 may be a multilayer structure. The multilayer structure shown in FIG. 15 may be similar to the structure previously described with reference to and shown in FIG. 3. For example, a semiconductor substrate 1512, dielectric layers 1514 and 1516, a cover layer 1518, a sub region 1502 and a scribe region 1504 in FIG. 15 have similar structures as the semiconductor substrate 314, the dielectric layers 316 and 318 and the cover layer 320, the sub region 302 and the scribe region 304 in FIG. 3. Thus the description of the structures of the semiconductor substrate 1512, the dielectric layers 1514 and 1516, the cover layer 1518, the sub region 1502 and the scribe region 1504 is omitted for brevity.

In some embodiments, the portion 1500 of the semiconductor device 100 may include one or more liners 1524a to 1524d disposed in the grooves 1506a and 1506b, that cover at least a portion of edge surfaces of the dielectric layers 1514. The dielectric layers 1514 may include low-k films. The liners 1524a to 1524d may include dielectric material, such as silicon dioxide (SiO2). In some embodiments, the edge surfaces of the dielectric layers 1514 may include portions 1522a and 1522b. The portions 1522a and 1522b may include concave portions in the edge surfaces of the dielectric layers 1514 facing the groove 1506a. The liners 1524a to 1524d may cover the portions 1522a and 1522b as well as the edge surfaces of the dielectric layers 1516 facing the grooves 1506a and 1506b, such as edge surfaces of dielectric films 1520a-1520c between the dielectric layers 1514 and the cover layer 1518. The liners 1524a to 1524d may provide surfaces, on which a barrier and conductive seed layer may be deposited continuously and seamlessly. Thus, a conductive pillar may be successfully formed by electroplating.

By providing liners on edge surfaces of dielectric layers (e.g., low-k films) having roughness, a barrier and conductive seed layer may be deposited on a top surface of a semiconductor device in a continuous and seamless manner. Thus, conductive pillars may be successfully formed by electroplating through the barrier and conductive seed layer.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:
1. An apparatus, comprising:
   a multilayer structure including:
      a first circuit region, a second circuit region and a scribe region between the first circuit region and the second circuit region;
      a substrate across the first circuit region and the second circuit region;
      a plurality of first dielectric layers above the substrate and across the first circuit region and the second circuit region, the plurality of first dielectric layers having a groove, which includes an edge surface having roughness, in the first dielectric layer and in the scribe region; and at least one second dielectric layer above the plurality of first dielectric layers; and at least one liner covering the edge surface of the plurality of dielectric layers to provide a surface smoother than the edge surface, wherein the plurality of first dielectric layers include a first material that has a dielectric constant lower than a dielectric constant of a second material included in the at least one second dielectric layer.

2. The apparatus of claim 1, wherein the at least one liner includes the second material.

3. The apparatus of claim 2, wherein the second material includes silicon dioxide (SiO2).

4. The apparatus of claim 1, further comprising a cover layer on the at least one second dielectric layer, the cover layer comprising a third material, wherein the at least one liner comprises the third material.

5. The apparatus of claim 4, wherein the third material comprises at least one of silicon nitride (Si3N4) or silicon carbide (SiC).

6. The apparatus of claim 4, wherein the at least one liner comprises a surface continuous with the cover layer.

7. The apparatus of claim 1, wherein the at least one liner is further configured to cover at least a portion of an edge surface of the at least one second dielectric layer.

8. The apparatus of claim 7, wherein the at least one liner is further configured to cover the edge surface of the at least one second dielectric layer.

9. The apparatus of claim 1, further comprising:

a wire in the at least one second dielectric layer in the circuit region;

a conductive seed layer on the wire; and a conductive pillar in a hole in the at least one second dielectric layer, the conductive pillar disposed on the conductive seed layer.

10. The apparatus of claim 9, wherein the conductive pillar comprises at least one of copper or nickel.

11. A semiconductor chip, comprising:

a first circuit region, a second circuit region, and a scribe region between the first circuit region and the second circuit region;

a substrate across the first circuit region and the second circuit region;

a plurality of first dielectric layers above the substrate and across the first circuit region and the second circuit region, the plurality of first dielectric layers having a groove, which includes an edge surface having roughness, in the first dielectric layer and in the scribe region;

at least one second dielectric layer above the plurality of first dielectric layers; and at least one liner covering the edge surface of the plurality of first dielectric layers to provide a surface smoother than the edge surface, wherein each of the plurality of first dielectric layers includes a first material that has a dielectric constant lower than a dielectric constant of a second material included in the at least one second dielectric layer.

12. The semiconductor chip of claim 11, wherein the at least one liner includes silicon dioxide (SiO2).

13. The semiconductor chip of claim 11, wherein the at least one liner includes at least one of silicon nitride (Si3N4) or silicon carbide (SiC).

14. The semiconductor chip of claim 11, wherein the at least one liner further covers at least a portion of an edge surface of the at least one second dielectric layer.

\* \* \* \* \*